(12) United States Patent
Suzuki et al.

(10) Patent No.: US 6,645,297 B1
(45) Date of Patent: Nov. 11, 2003

(54) ROLL COATER FOR COATING AND METHOD OF MANUFACTURING PRINTED WIRING BOARD EMPLOYING THE ROLL COATER

(75) Inventors: Ayumi Suzuki, Ogaki (JP); Ayao Niki, Ogaki (JP); Ryo Aoki, Ogaki (JP); Kazuhisa Kitajima, Ogaki (JP); Susumu Kagohashi, Ogaki (JP); Yukari Kajiyama, Kariya (JP); Hiroshi Tanaka, Kariya (JP)

(73) Assignees: Ibiden Co., Ltd., Gifu (JP); Kabushiki Kaisha Toyoda Jidoshokki Seisakusho, Aichi (JP)

( * ) Notice: Subject to any disclaimer, the term of this patent is extended or adjusted under 35 U.S.C. 154(b) by 148 days.

(21) Appl. No.: 09/868,138
(22) PCT Filed: Oct. 26, 2000
(86) PCT No.: PCT/JP00/07490
§ 371 (c)(1),
(2), (4) Date: Aug. 21, 2001
(87) PCT Pub. No.: WO01/30509
PCT Pub. Date: May 3, 2001

(30) Foreign Application Priority Data

Oct. 26, 1999 (JP) .......................................... 11-303807

(51) Int. Cl.⁷ .......................... B05C 11/02; B05C 1/00; B05D 3/12; B05D 1/28
(52) U.S. Cl. ...................... 118/110; 118/224; 118/256; 427/359; 427/428; 492/30
(58) Field of Search ............................. 427/359, 428; 118/110, 118, 244, 252; 492/28–39

(56) References Cited

U.S. PATENT DOCUMENTS 5,445,588 A * 8/1995 Ishibashi et al. .............. 492/31
6,099,909 A * 8/2000 Rantanen et al. ............ 427/356

FOREIGN PATENT DOCUMENTS

| JP | 11-262709 | | 9/1989 |
|----|-----------|---|--------|
| JP | 5-20461 | | 5/1993 |
| JP | 8-10392 | | 3/1996 |
| JP | 9-130050 | | 5/1997 |
| JP | 216588 | * | 8/1998 |
| JP | 10-216588 | | 8/1998 |
| JP | 10-233579 | | 9/1998 |
| JP | 11-156262 | | 6/1999 |
| JP | 262709 | * | 9/1999 |

* cited by examiner

Primary Examiner—Brian K. Talbot
(74) Attorney, Agent, or Firm—Sughrue Mion, PLLC

(57) ABSTRACT

A roll coater with which an interlaminar resin insulating layer and/or a solder resist layer can be formed with good thickness uniformity to enable the manufacture of a printed circuit board free from the no-hole defect and anomalies in the diameter and geometry of the holes for via-hole and/or solder bump which is due to uneven layer thickness, thus having high electrical integrity and reliability. This roll coater 20 is used for forming an interlaminar resin insulating layer and/or a solder resist layer in the manufacture of a printed circuit board including a substrate and, as serially built up thereon, a conductor circuit and an interlaminar insulating layer in an alternate fashion and in repetition, with a solder resist layer formed on top of the resulting multilayer structure, which comprises rolls 21 each having a surface formed with a multiplicity of grooves running in the direction of roll rotation, with the grooves 22a, 22b in the roll-end or marginal areas 21a of the surface being relatively reduced in depth as compared with the remaining area.

7 Claims, 13 Drawing Sheets

(a)

(b)

(c)

ROLL COATER FOR COATING AND METHOD OF MANUFACTURING PRINTED WIRING BOARD EMPLOYING THE ROLL COATER

TECHNICAL FIELD

The present invention relates to a roll coater with which an interlaminar resin insulating layer or a solder resist layer can be formed with good thickness uniformity and to a method of manufacturing a printed circuit board which utilizes said roll coater.

BACKGROUND ART

The multi-layer printed circuit board which is commonly referred to as multilayer built-up printed circuit board has heretofore been manufactured typically by the semi-additive method in which a copper or other conductor circuit and an interlaminar resin insulating layer are alternately built up on a glass cloth- or other reinforced resin substrate about 0.5 to 1.5 mm thick which is generally called "core". Conductor circuit-circuit interconnection through said interlaminar resin insulating layer of the multilayer printed circuit board is achieved by means of via-hole.

The built-up multilayer printed circuit board is conventionally manufactured by the process described in JP H09-130050 A, for instance.

Thus, holes are drilled through the thickness of a copper-clad laminate board in the first place and electroless copper plating is then carried out to form plated-through holes. Then, the surface of the substrate is etched pattern-wise to form a conductor circuit and the surface of the conductor circuit is roughened by electroless plating or etching. On the conductor circuit pattern having such a roughened surface, a resin insulating layer is constructed and subjected to exposure to light and development to form openings for via-hole. Then, UV curing and postcuring are carried out to complete the interlaminar resin insulating layer.

Further, the surface of interlaminar resin insulating layer is roughened with an acid or an oxidizing agent and an electroless plating layer is formed thereon. After a plating resist is applied onto this electroless plating film, salvage electroplating is carried out, followed by removal of the plating resist and etching to form a conductor circuit which is electrically connected to an under-level conductor circuit through said via-hole.

After the above procedure is repeated, finally a solder resist layer for protecting the conductor circuit is formed, the exposed hole for connection to electronic components, such as an IC chip, a mother board, etc. are plated, and solder bumps are formed by printing with a solder paste to complete the manufacture of a built-up multilayer printed circuit board.

Regarding the method of forming an interlaminar resin insulating layer in the manufacture of a multilayer printed circuit board, JP H10-65348 A discloses a method of manufacturing a printed circuit board which comprises setting a substrate in vertical position between two co-operating rolls of a roll coater to concurrently coat both sides of the substrate with an interlaminar insulating resin coating to form an interlaminar resin insulating layer on either side of the substrate.

This method of manufacturing a printed circuit board in which a coating layer is formed on either side of a substrate in one operation is advantageous not only in terms of productivity but also in that because the interlaminar insulating coating is dried on both sides of the substrate concurrently, the curling of the substrate resulting from drying of the interlaminar insulating coating is precluded.

Meanwhile, JP H10-65347 A discloses a method of manufacturing a printed circuit board which includes a step of applying the interlaminar insulating coating only to the inner area exclusive of both marginal areas of a substrate.

This method of manufacturing a printed circuit board offers the advantage that the substrate can be handled and transferred without incurring contamination of the interlaminar resin insulating layer with dust particles.

SUMMARY OF THE INVENTION

However, an interlaminar resin insulating layer, and for that matter a solder resist layer, as formed by using the roll coater described in the above patent literature tends to have the drawback of uneven coating thickness.

Thus, in order to level out the streak pattern that would be produced by said roll coater, the roll coating is performed under pressure application but when the substrate is smaller in width than the coating roll, the edge portions of the substrate are subjected to excessive pressure with the consequent reduction in thickness of the marginal areas. Moreover, when the coating is carried out using a coating roll smaller in width than the substrate from handling considerations, the edges of the rubber member of the roll under pressure expand outwardly in the lateral direction to cause local reductions in pressure so that the thickness of the coat is locally increased.

When a mask drawing circular marks for via-hole or solder pad, or other marks is placed on such an interlaminar resin insulating layer having relatively thickened edges or an uneven thickness, the mask is tilted along the gradient of thickness with the consequence that the ultraviolet or other exposure light from a light source is incident aslant so that holes of the designed geometries cannot be formed.

The failure to form a hole of the designed geometry results in a connection failure or an increased risk for disconnection between the conductor circuit formed on the interlaminar resin insulating layer and the under-level conductor circuit beneath the insulating layer in the formation of via-hole. Moreover, in the heat cycle test and the reliability test under high-temperature, high-humidity condition, the exfoliation and disconnection of the conductor within the via-hole tend to take place.

Furthermore, the morphologic uniformity of the solder bump formed at the apertures of the solder resist layer cannot be obtained, leading to a failure to establish connection with an IC chip and other electronic components and difficulties in the formation of an anticorrosive layer of nickel, palladium or other noble metal on the conductor circuit. In addition, peeling of the anticorrosive metal layer or the solder bump and early onset of corrosion may occur to adversely affect electrical continuity and reliability.

Having been developed to overcome the above disadvantages, the present invention has for its object to provide a roll coater with which the interlaminar resin insulating layer and the solder resist layer can be formed each in a uniform thickness and no-hole defect anomalies in the diameter and geometry of the opening for via-hole or solder bump can be precluded to provide a printed circuit board improved in electrical continuity and operational reliability and a method of manufacturing such a printed circuit board using said roll coater.

As the result of an intensive investigation made to accomplish the above object, the inventors of the present invention found that when the amount of the interlaminar insulating coating to be held by the coating roll in both end marginal areas of its surface is relatively reduced, the coating amount in said marginal areas will not become excessive even if the interlaminar insulating coating applied to the central area of the roll surface is forced out towards said marginal areas so that the resulting interlaminar resin insulating layer will be uniformized. The present invention having the following cardinal feature has been developed on the basis of the above finding.

The roll coater of the present invention is a coating apparatus for use in the formation of an interlaminar resin insulating layer and/or a solder resist layer of a printed circuit board comprising a substrate and, as serially built up thereon, a conductor layer and an interlaminar resin insulating layer in an alternate fashion and in repetition, with a solder resist layer formed on top of the resulting multilayer structure, which roll coater comprising a roll each having a surface formed with a multiplicity of grooves running in the direction of roll rotation, with the depth of the grooves in both marginal (peripheral end) areas of the roll surface being relatively reduced as compared with the depth of the grooves in the remaining area.

Preferably, in the above roll coater, said depth of grooves in said marginal areas are progressively reduced toward the corresponding ends of the roll.

The depth of the grooves in outermost regions of said marginal areas is preferably 10 to 50% less than the depth of the grooves in other region.

Furthermore, the width of each marginal area where the depth of grooves is relatively reduced as compared with the remaining area is preferably not greater than 5 cm.

In addition, both edges of the roll coater are preferably comprising a guide at each end of the roll.

The method of manufacturing a printed circuit board according to the present invention comprises forming a conductor layer and an interlaminar resin insulating layer serially in an alternate fashion and in repetition on a substrate and a solder resist layer on top of the resulting multilayer structure, characterized in that said interlaminar resin insulating layer and/or said solder resist layer is formed by means of the above-described roll coater.

Figure 1:
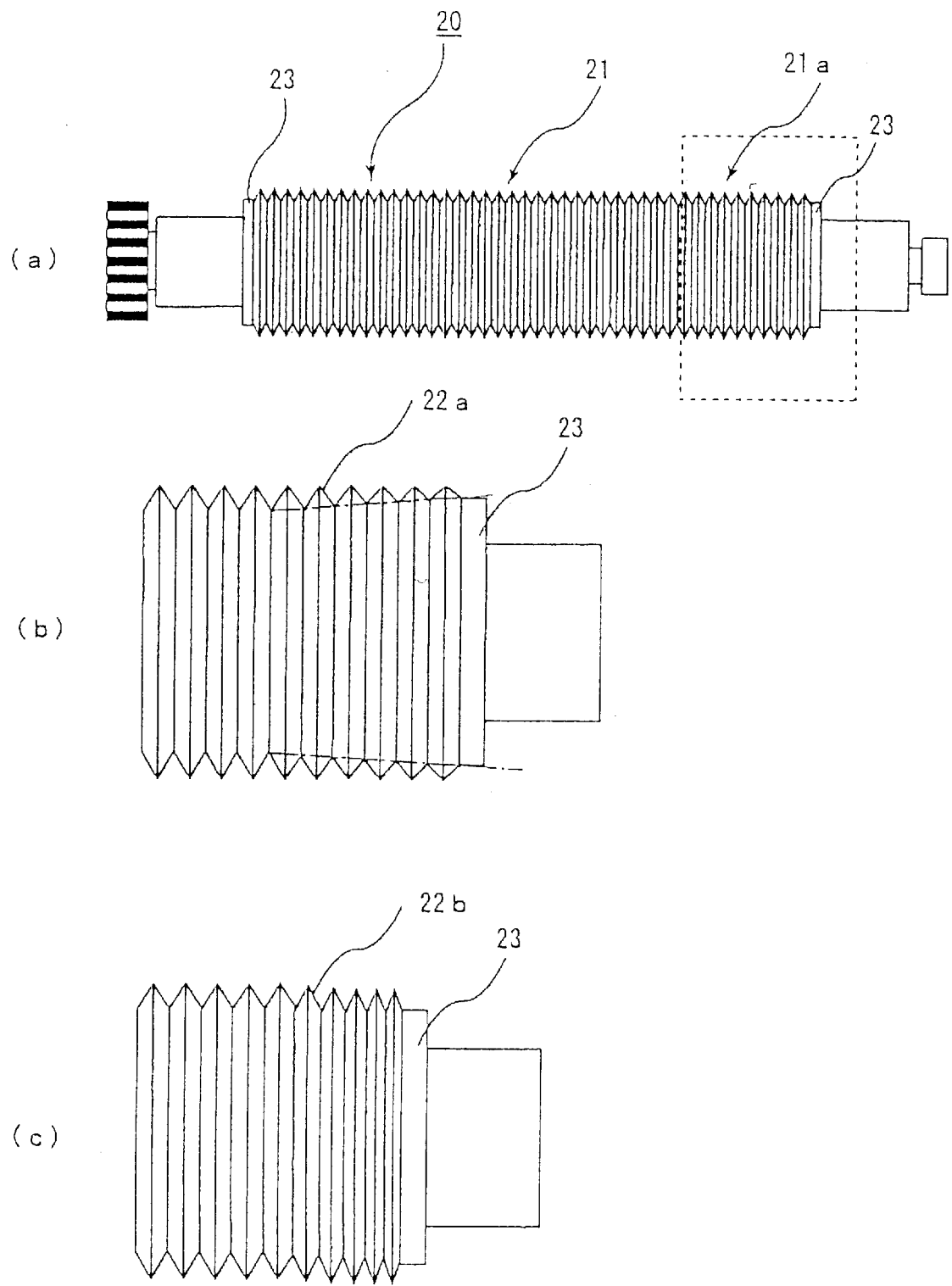
FIG. 1 is a schematic diagram showing a roll coater embodying the principles of the invention, wherein (a) is a front view, (b) is a view showing a marginal region of the roll on exaggerated scale, and (c) is a similar view showing a marginal region of the roll of another roll coater embodying the principles of the invention.

| Explanation of the Numeric symbols | |
|---|---|
| 1 | substrate |
| 2a,2b | electroless plating adhesive layer |
| 2 | interlaminar resin insulation layer |
| 4 | underlevel conductor circuit |
| 4a | roughened surface |
| 5 | upperlevel conductor circuit |
| 6 | opening for via-hole |
| 7 | via-hole |
| 8 | copper foil |
| 9 | plated-through hole |
| 10 | resin filler |
| 11 | roughened layer |
| 12 | electroless plating layer |
| 13 | electroplating layer |
| 14 | solder resist layer |
| 15 | nickel plating layer |
| 16 | gold plating layer |
| 17 | solder bump |
| 20 | roll coater for applying |
| 21 | roll |
| 21a | Edge of the roll |
| 22a,22b,22c,22d,22e | Groove |
| 23 | guide |

DETAILED DISCLOSURE OF THE INVENTION

The roll coater of the present invention is a coating apparatus for use in the formation of an interlaminar resin insulating layer and/or a solder resist layer for a printed circuit board comprising a substrate and, as serially built up thereon, a conductor layer and an interlaminar resin insulating layer in an alternate fashion and in repetition, with a solder resist layer being superimposed on the topmost layer, said roll coater being characterized in that the roll surface of said roll coater is formed with a multiplicity of grooves running in the direction of roll rotation with the depth of the grooves in both end marginal areas of the roll surface being relatively reduced as compared with depth of the remaining area.

In the above roll coater of the present invention, wherein the grooves in both end marginal areas, among the grooves formed on the roll surface, are formed in reduced depth as compared with the depth of the grooves in the remaining area, the amount of the interlaminar insulating coating held by the roll in said marginal areas of its surface is reduced so that even if the pressure acting on the substrate is reduced in the marginal areas to cause an increase in the amount of the interlaminar insulating coating deposited on the substrate, the thickness of the resultant interlaminar insulating coating layer can be uniformized.

Moreover, while the roll is given a uniform pressure in the direction of the substrate, this pressure escapes in a direction parallel to the substrate at the ends of the roll and, hence, the roll is deformed in the direction parallel to the substrate leading to a reduction in coating pressure with an increased clearance between the substrate and the roll surface at the roll ends and, as a result, the coating amount may be somewhat increased even if the grooves in said marginal areas have been relatively reduced in depth. However, when both ends of the roll are provided with guide means restricting said deformation, the roll deformation is arrested by the guide means so that the clearance between the substrate and the roll surface cannot increase, thus contributing further to the thickness uniformity of the interlaminar resin insulating layer which can be obtained.

When a mask drawing circular patterns for the formation of via-hole and solder pad is set in position on the interlaminar resin insulating layer having such a level surface, the mask is not tilted but comes into uniformly intimate contact with the interlaminar resin insulating layer so that holes each true to the designed geometry can be obtained. As a consequence, a via-hole and a solder bump impeccably connected to the under-level conductor circuit can be provided.

The roll coater of the present invention is characterized in that its roll surface is formed with a multiplicity of grooves running in the direction of rotation of the roll with the grooves in the marginal areas adjoining to roll ends having been reduced in depth as compared with the remainder of the roll surface.

Grooves may be present on the entire surface of the roll coater or there may be a surface or surfaces not formed with such grooves.

FIG. 1 is a schematic view showing a roll coater embodying the principles of the invention, in which (a) is a front view, (b) is a view showing a marginal area of the roll surface on exaggerated scale, and (c) is a similar view showing a marginal area of the roll surface in another embodiment.

As illustrated in FIG. 1(b), grooves 22a in each roll-end marginal area are relatively reduced in depth as compared with the remaining area, the depth of groove 22a diminishing progressively toward the outermost end. Though not shown, grooves in the other roll-end marginal area are also reduced in depth toward the corresponding outermost end in a similar fashion. Furthermore, a guide 23 is provided at either end of the roll 21 for restricting deformation of the roll 21 to thereby insure a greater thickness uniformity of the resulting film.

The depth of grooves 22a in the marginal areas is preferably smaller by 10 to 50% than the depth of grooves H in the remaining area. Thus, with the depth of grooves in said marginal areas being written as d and the depth of grooves in the remaining area as D, the following relation is preferably satisfied.

$$0.5D \leq d \leq 0.9D \tag{1}$$

If the difference in depth is less than 10% (d>0.9D), the effect of relative reduction in the depth of grooves will not be expressed to a satisfactory extent but rather the edges of the layer formed will become thickened. On the other hand, if the difference in depth exceeds 50% (0.5D>d), the edges of the interlaminar resin insulating layer will be too much reduced in thickness so that the thickness uniformity of the layer may not be insured.

Usually, the pitch of grooves in the marginal areas is preferably equal to the pitch of grooves in the other area. Furthermore, instead of reducing the depth of grooves in the marginal areas 21a, the pitch of these grooves 22b may be made smaller as shown in (c) As a further alternative, both the depth and pitch of grooves in the marginal area may be reduced.

The width of said marginal areas in which relatively shallow grooves are formed is preferably not more than 5 cm each. Since the total width of the roll in common use is 325 to 480 cm, the thick uniformity of the layer may not be attained if the marginal width is greater than 5 cm.

Generally speaking, the proper groove depth, geometry, pitch, etc. of the roll vary with the various factors such as the material of which the roll is made; factors related to the interlaminar insulating coating to be used, e.g. the viscosity of the resin, the relative amount of the solvent vehicle, the formulating amount of fillers, etc.; and factors related to coating parameters and the substrate to be coated, e.g. coating thickness and the surface hardness and irregularities of the substrate and, as such, cannot be specified in general terms. However, the following ranges, though approximate, are preferred.

Figure 2:
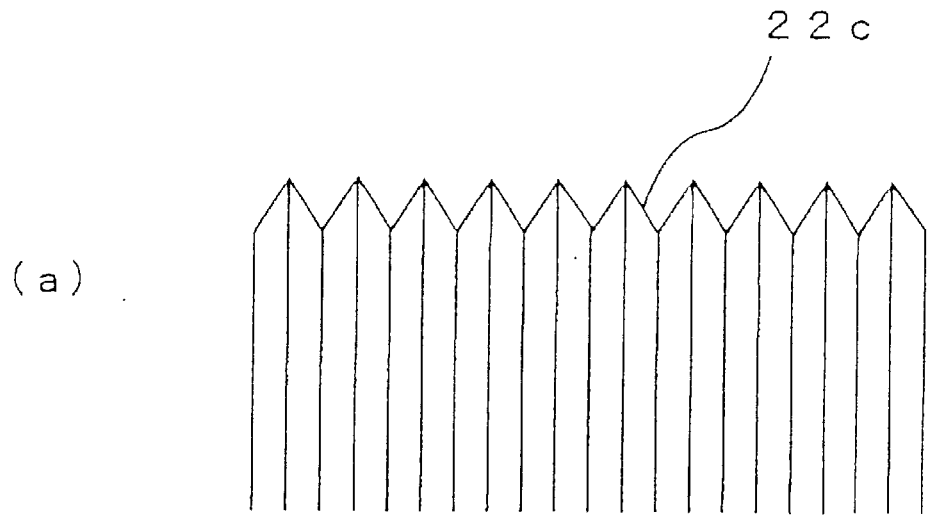
FIGS. 2(a) to (c) are schematic front views showing various groove geometries for the roll coater according to the invention.
Figure 2:
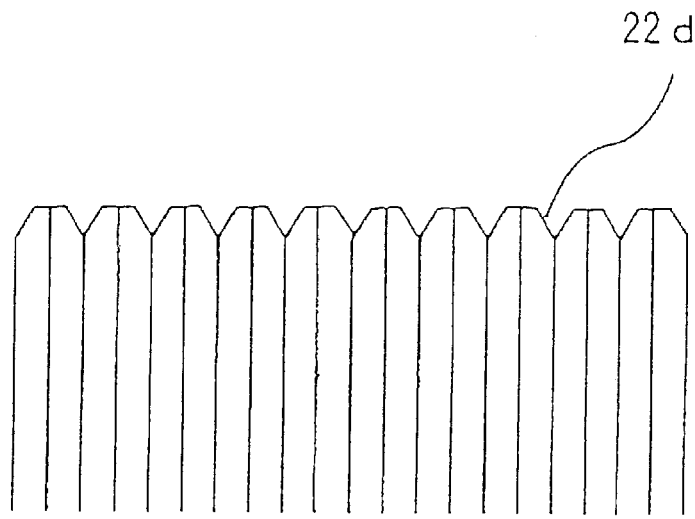
Figure 2:
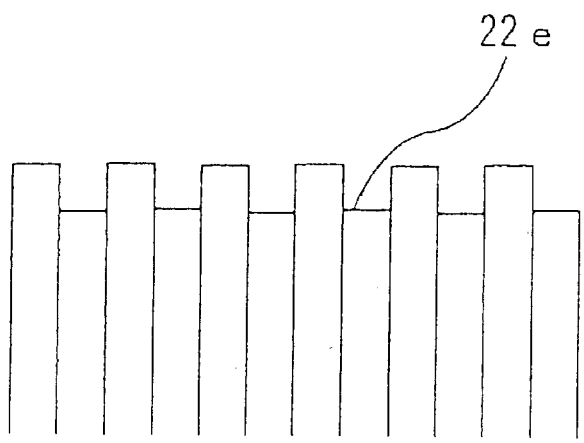

Thus, the depth of grooves in the central area is preferably 100 to 900 $\mu$m, more preferably 300 to 700 $\mu$m. As regards the crest profile of said grooves, it may for example be triangular, trapezoid, quadrangular or elliptical. As specific examples of the sectional configuration, the grooves 22c, 22d and 22e illustrated in FIGS. 2(a) to (c) can be mentioned. The number of grooves formed is preferably 2 to 20 per 1 cm of roll width and the pitch of the grooves is preferably constant.

The material of the roll is not particularly restricted but may for example be a resin or a rubber. However, it is preferable to use a material which does not cause contamination of the interlaminar resin insulating layer with foreign matter even when the roll is used continuously and gives a roll having a low coefficient of friction.

As specific examples of the material of which the roll is made, there can be mentioned butyl rubber, ethylene/propylene rubber and pentane rubber, among others. Particularly preferred, among them, are butyl rubber and ethylene/propylene rubber. This is because these materials are highly solvent-resistant and resistant to wear and can be used steadily.

The procedure for manufacturing a roll for the roll coater according to the present invention is now described.

Figure 3:
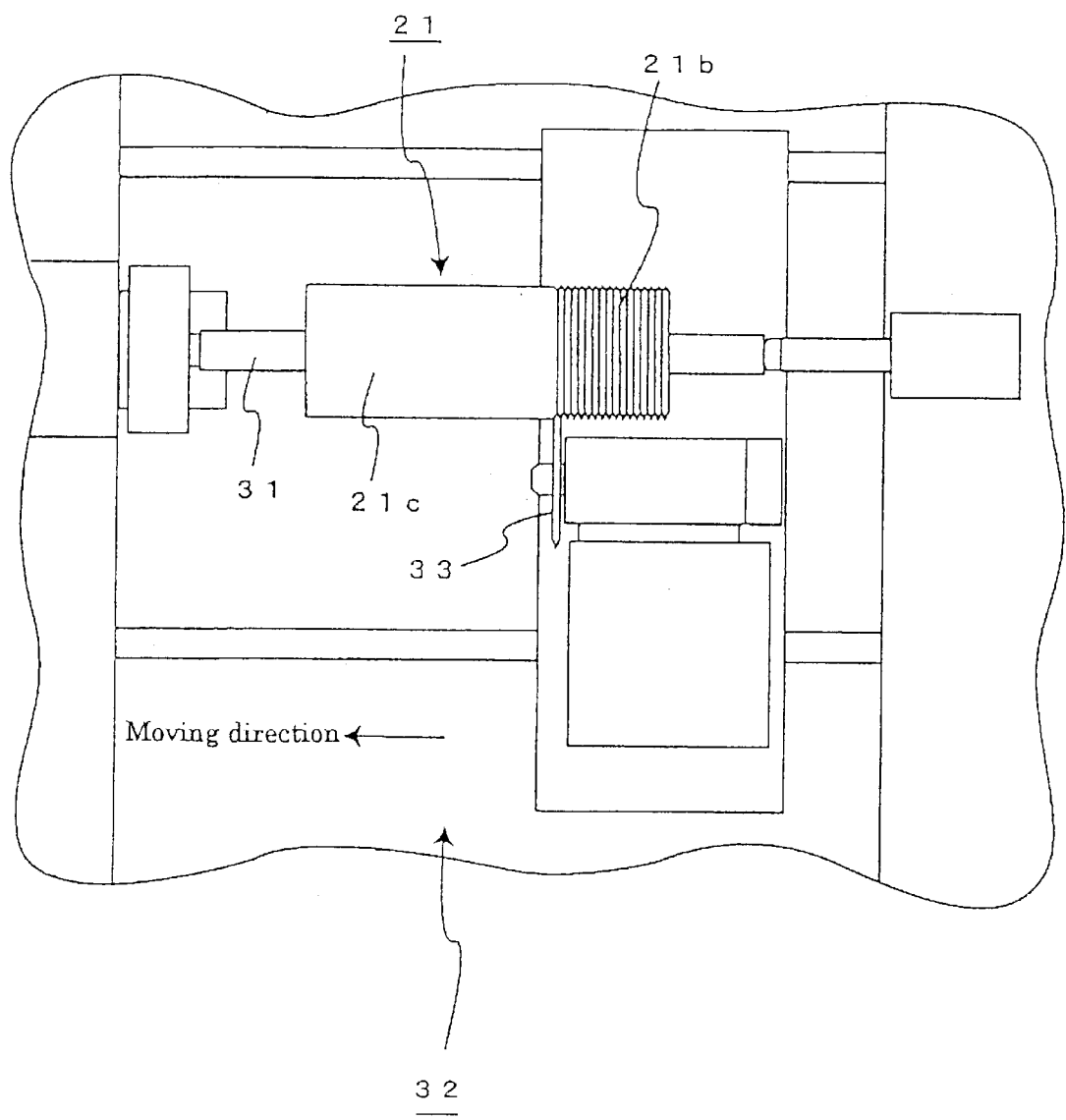
FIG. 3 is a schematic plane view illustrating the production of the roll for the roll coater of the invention by using a NC lathe.

FIG. 3 is a schematic plane view of the process for production of said roll by means of a NC lathe.

A cylindrical roll 21 is mounted rigidly on the spindle 31 of a lathe and the peripheral surface of the roll is machined with the grinding wheel of the lathe to form grooves 21b as conventionally done. In the present invention, these grooves 21b are cut using the disk-shaped grinding stone 33, which cuts at its peripheral edge, of a numerical-controlled (NC) lathe 32 as illustrated in FIG. 3. In this embodiment, a diamond wheel is used as said disk-shaped grinding stone.

This NC lathe 32 is controlled to continuously rotate the grinding wheel 33 at a preset speed (rpm) and, at the same time, drive it in the axial direction of the spindle at a feeding rate corresponding to the designed pitch of grooves 21b. In addition, under the above settings, the grinding wheel 33 is controlled to trace a helical path around the peripheral surface 21c of the roll 21 from one end to the other end of the roll 21.

Furthermore, this NC lathe 32 driving the grinding wheel 33 along said helical path is programmed to switch the distance of displacement of the peripheral edge of the grinding wheel 33 from the peripheral surface 21c of the roll 21 toward the central axis of the roll 21 (which is referred to as the depth of cut) for the marginal areas of the roll and cuts in 3 repetitions along one and the same path.

In said repeated machining along the same path, the lathe is controlled to select a greater depth of cut than the depth of cut used in the preceding machining run. Furthermore, this NC lathe 32 is programmed to insure that the difference between the depth of cut in the current run and the depth of cut in the preceding run(the difference is referred to as the push-in amount) will be smaller than the push in amount of the preceding run. Thus, the depth of the grooves formed ultimately is the depth of grooves formed by the last machining run. In this embodiment, the NC lathe 32 is controlled to cut the grooves 21b in 3 runs.

The coating composition for use in forming an interlaminar resin insulating layer using the roll coater of the present invention may for example be a paste-like dispersion of a thermosetting resin, a thermoplastic resin and a partially photosensitized thermosetting resin or a composite resin thereof in a solvent; an adhesive for electroless plating use(which is referred to as electroless plating adhesive); or the like. The viscosity of the paste is preferably adjusted to 1 to 10 Pa·s at 25° C.

The optimum electroless plating adhesive said above is a dispersion of a cured heat-resistant resin particles, which are soluble in an acid or an oxidizing agent, in an uncured heat-resistant resin, which is hardly soluble in the acid or oxidizing agent. As the coated surface is treated with the acid or oxidizing agent, the heat-resistant resin particles are dissolved and removed to leave a roughened surface consisting of anchors looking like octopus trap-pots. In use, particles of such a resin are dispersed in a solvent such as diethylene glycol dimethyl ether, N-methylpyrrolidone or the like to give a paste which, where necessary, is supplemented with a photopolymerization initiator, a curing agent, an antifoam, and other additives.

For use in the above electroless plating adhesive, said cured heat-resistant resin particles are preferably (a) a heat-resistant resin powder having a mean particle diameter of not more than 10·μm, (b) an aggregated particles consisting of heat-resistant resin powder having a mean diameter of not more than 2 μm, (c) a mixture of a heat-resistant resin powder having a mean particle diameter of 2 to 10 μm and a heat-resistant resin powder having a mean particle diameter of not more than 2 μm, (d) a pseudo-powder consisting of a heat-resistant resin powder having a mean particle diameter of 2 to 10 μm and, as deposited thereon for cladding, at least a heat-resistant resin powder or inorganic powder having a mean particle diameter of not more than 2 μm, (e) a mixture of a heat-resistant resin powder having a mean particle diameter of 0.1 to 0.8 μm and a heat-resistant resin powder having a mean particle diameter of more than 0.8 μm but less than 2 μm, or (f) a heat-resistant resin powder having a mean particle diameter of 0.1 to 1.0 μm. This is because, with these powders, anchors of more complicated geometry can be provided.

Said heat-resistant resin which is hardly soluble in an acid or an oxidizing agent is preferably a "composite resin consisting of a thermosetting resin and a thermoplastic resin" or a "composite resin consisting of a photosensitive resin and a thermoplastic resin". The former is highly heat-resistant and the latter enables formation of holes for via-hole by a photolithographic technique.

The thermosetting resin mentioned above includes epoxy resin, phenol resin and polyimide resin, among others. The photosensitized resin includes resins whose thermosetting groups have been acrylated with methacrylic acid or acrylic acid. Particularly preferred is an acrylated epoxy resin.

The epoxy resin which can be used includes novolac epoxy resins such as phenol-novolac and cresol-novolac epoxy resins, dicyclopentadiene-modified alicyclic epoxy resins, and others.

The thermoplastic resin which can be used includes polyether sulfone (PES), polysulfone (PSF), polyphenylene sulfone (PPS), polyphenylene sulfide (PPES), polyphenylether (PPE), polyetherimide (PI) and fluororesin, among others.

The blending ratio of the thermosetting resin (photosensitive resin) to the thermoplastic resin is preferably 95/5 to 50/50, for within this range, high toughness can be insured without sacrificing heat resistance.

The proportion of said heat-resistant resin particles is preferably 5 to 50 weight %, more preferably 10 to 40 weight %, relative to the nonvolatile matter of the heat-resistant matrix resin.

The heat resistant resin particle is preferably particle of an amino resin (melamine resin, urea resin, guanamine resin) or an epoxy resin.

Together with said heat-resistant resin particles, inorganic particles such as silica, alumina etc. or metal particles may be dispersed in said heat-resistant resin. Also said inorganic particles may be used instead of said heat resistant resin particles.

The coating composition which may be used for constructing a solder resist layer by means of the roll coater of the present invention includes a pasty fluid containing a novolac epoxy resin (meth)acrylate, an imidazole curing agent, a bifunctional (meth)acrylate monomer, a (meth) acrylate polymer within the molecular weight range of about 500 to 5000, a thermosetting resin such as a bisphenol epoxy resin, a photosensitive monomer such as a polyacrylic monomer, a glycol ether solvent, etc. The viscosity of this fluid is preferably adjusted to 1 to 10 Pa·s at 25° C.

The procedure for forming an interlaminar resin insulating layer using the above electroless plating adhesive and others comprises setting a substrate formed with a conductor circuit on either side in vertical position between the paired co-operating rolls of the roll coater of the invention and driving the rolls to apply a coating composition of the above formulation to the substrate surfaces. By this procedure, a coating layer which is uniform in thickness is constructed on either side of the substrate.

Then, the coating is dried to give cured interlaminar resin films which are then formed with openings for via-hole. In this manner, an interlaminar resin insulating layer is formed in a uniform thickness on the conductor circuit.

For the construction of a solder resist layer, too, the same procedure as above can be followed using the roll coater of the invention to provide a solder resist layer having a uniform thickness.

The procedure for manufacturing a printed circuit board in accordance with the present invention is now described briefly.

(1) In the present method of manufacturing a printed circuit board, a substrate is first prepared by forming a conductor circuit on either side of an insulating board.

The insulating board is preferably a resin board, such as a glass-epoxy, polyimide, bismaleimide-triazine resin, or fluororesin board. A ceramic board, a copper-clad laminate board, etc. are also preferable.

In the present invention, this insulating board is drilled or otherwise processed to form through holes. Then, the wall surfaces of the through holes and the surface of the copper foil are electroless-plated to form plated-through holes and a surface conductive film. The preferred electroless plating is electroless copper plating.

After this electroless plating, usually the inner wall of the plated-through holes and the conductive surface are roughened. The roughening can be made by various methods, e.g. blackening (oxidation)-reduction, spraying with a mixed aqueous solution of an organic acid and a copper (II) complex, or Cu—Ni—P acicular (needle) alloy plating.

(2) Then, on the electroless-plated substrate, an etching resist having a predetermined conductor circuit pattern is formed and an etching operation is carried out to form the corresponding conductor circuit. A resin filler is applied to the surface of the substrate carrying the above conductor circuit and dried to a semi-cured state. The resin filler layer and the top surface of the conductor circuit are ground to flatten both principal surfaces of the substrate. Thereafter, the resin filler layer is caused to cure completely.

In forming this resin filler layer, the non-circuit areas recessed by etching may be selectively filled with the resin filler using a mask drawing apertures for the non-circuit areas and, thereafter, the above grinding treatment be carried out.

(3) Then, a roughened layer or rough surface (hereinafter referred to as roughened layer) is formed on the conductor circuit. The method for roughening includes a blackening (oxidation)-reduction treatment, a spray treatment using a mixed aqueous solution of an organic acid and a copper (II) complex, and a Cu—Ni—P acicular alloy plating technique.

(4) Where necessary, a cover layer of tin, zinc, copper, nickel, cobalt, thallium, lead or the like metal is formed on the roughened layer surface by electroless plating or vapor deposition or other means. By precipitating the cover-layer metal in a thickness of 0.01 to 2 $\mu$m, the conductor circuit exposed from the interlaminar resin insulating layer can be protected against the roughening solution and etching solution and the tarnishing and dissolution of the inner-layer pattern can be prevented with certainty.

(5) Then, an interlaminar resin insulating layer is constructed on this conductor circuit formed with a roughened layer.

For this purpose, an electroless plating adhesive layer is formed using the above coating composition or others in the above-described manner and dried, for instance.

(6) Then, the interlaminar resin insulating layer is cured and provided with holes for via-hole.

The holes in the interlaminar resin insulating layer are formed by means of laser light or oxygen plasma or others in the case where the resin matrix of the electroless plating adhesive is a thermosetting resin or by exposure and development in the case where the matrix is a photosensitive resin. This exposure-development process comprises placing a photomask (preferably a glass substrate) drawing circular patterns for via-hole with the patterned side in intimate contact with the photosensitive interlaminar resin insulating layer, followed by exposure to light and development by dipping in a developer solution or spraying with the developer solution.

By curing the interlaminar resin layer formed on the sufficiently roughened surface of the conductor circuit in the above manner, there can be obtained an interlaminar insulating layer with good adhesion to the conductor circuit.

(7) Then, the surface of the interlaminar resin insulating layer provided with holes for via-hole is roughened. Usually this roughening is carried out by dissolving out the heat-resistant resin particles on the surface of the electroless plating adhesive layer with an acid or an oxidizing agent.

The height of the roughened surface formed by such acid treatment or the like is preferably Rmax=0.01 to 20 $\mu$m. This range is useful for insuring a good adhesion to the conductor circuit. Particularly in the semi-additive process, the preferred height is 0.1 to 5 $\mu$m. Within this range, the electroless plating film can be removed without detracting from adhesion.

The acid treatment can be carried out with an inorganic acid, such as phosphoric acid, hydrochloric acid or sulfuric acid, or an organic acid, such as formic acid or acetic acid. Particularly preferred is an organic acid. This is because the metal conductor layer exposed from the via-hole will not easily be corroded in the roughening procedure.

The oxidizing treatment is preferably carried out using chromic acid or permanganate salt (e.g. potassium permanganate).

Replacing above steps (5) to (7), the holes for via-hole may be formed by means of $CO_2$ laser or the like, after laminating resin film in semi-cured state (B stage state) on the substrate, the resin film being composed of one selected from epoxy resin, polyimide resin, phenol resin and composite of those with thermosetting resin; inorganic particles such as silica, alumina, dolomite or others and curing agent. Those steps are followed by curing and roughing by oxidizing agent such as chromic acid or a permanganic acid. When those steps are adopted, the roll coater of the present invention is only used in the process of forming solder resist layer.

(8) Then, a thin electroless plating film is formed all over the surface of the roughened interlaminar resin insulating layer. This electroless plating is preferably electroless copper plating and the film thickness is preferably 1 to 5 $\mu$m, more preferably 2 to 3 $\mu$m.

(9) A plating resist is then formed on top of the electroless plating film. The plating resist may be a commercial light-sensitive dry film or a liquid resist.

After application of the light-sensitive dry film or coating with the liquid resist, an exposure with ultraviolet light is carried out and a development is made with an aqueous alkali solution.

(10) The substrate treated as above is dipped in an electroplating solution and, then, using the electroless plating layer as the cathode and the plated metal as the anode, DC electroplating is performed to fill the holes for via-hole and, at the same time, form an upper-level conductor circuit.

The electroplating is preferably copper electroplating and the plating thickness is preferably 10 to 20 $\mu$m.

(11) The plating resist is stripped with an aqueous strong alkali solution and the electroless plating layer is etched off to make the upper-level conductor circuit and a via-hole as discrete elements.

As said etching solution, an aqueous solution of sulfuric acid/hydrogen peroxide, ferric(II) chloride, cupric(II) chloride or the like, or an aqueous solution of a persulfate salt such as ammonium persulfate, among others, is employed.

The palladium catalyst nucleus exposed on the non-conductor circuit area is dissolved off with a reagent such as chromic acid, sulfuric acid, hydrogen peroxide.

(12) Where necessary, the sequence of (3) to (11) is repeated and the topmost conductor circuit is subjected to electroless plating and etching under the same conditions as in the above step (3) to form a roughened layer or surface on the topmost conductor circuit.

Then, using the coating composition described above and the roll coater of the present invention, the substrate surface including the above topmost conductor circuit is coated with the coating composition in the same manner as in the formation of the interlaminar resin insulating layer to construct a coating layer. Then, holes are made in the areas where solder bumps are to be formed and a curing treatment is further carried out to form a solder resist layer.

Thereafter, solder bumps are formed in the open areas of the solder resist layer to complete the manufacture of a printed circuit board.

A code printing step for impressing the product identification characters and the like and an oxygen or carbon tetrachloride plasma treatment for modifying the solder resist layer may also be performed when necessary.

While the above procedure is applicable to the semi-additive process, the full-additive process may also be employed.

BEST MODE FOR CARRYING OUT THE INVENTION

The following examples are further illustrative of the present invention.

EXAMPLE 1

A. Preparation of an Electroless Plating Adhesive (Upper-layer Adhesive)

(i) A vessel is charged with 35 weight parts of a 80 wt. % resin solution prepared by dissolving cresol-novolac epoxy resin (made by Nippon Kayaku.Co, mol. wt. 2500) 25% acrylate in diethylene glycol dimethyl ether (DMDG), 3.15 weight parts of photosensitive monomer (made by Toa Gosei.Co, Aronix M315), 0.5 weight part of antifoam (made by San Nopco.Co, S-65) and 3.6 weight parts of N-methylpyrrolidone (NMP), followed by mixing to prepare a mixed composition.

(ii) Another vessel was charged with 12 weight parts of polyether sulfone (PES), 7.2 weight parts of particulate epoxy resin (made by Sanyo Kasei.Co, Polymer Pol) with a mean particle diameter of 1.0 $\mu$m and 3.09 weight parts of the same epoxy resin with a mean particle diameter of 0.5 $\mu$m, followed by mixing. Then, 30 weight parts of NMP was further added and the whole mixture was stirred in a beads mill to prepare another mixed composition.

(iii) A still another vessel was charged with 2 weight parts of imidazole curing agent (made by Shikoku Kasei.Co, 2E4MZ-CN), 2 weight parts of photopolymerization initiator (made by Ciba Specialty Chemicals.Co, Irgacure I-907), 0.2 weight part of photosensitizer (made by Nippon Kayaku.Co, DETX-S) and 1.5 weight parts of NMP, followed by stirring to prepare a mixed composition.

The mixed compositions prepared in (i), (ii) and (iii) above were blended to give an electroless plating adhesive.

B. Preparation of an Electroless Plating Adhesive (Under-layer Adhesive)

(i) A vessel is charged with 35 weight parts of a 80 wt. % resin solution prepared by dissolving cresol-novolac epoxy resin (made by Nippon Kayaku.Co, mol. wt. 2500) 25% acrylate in diethylene glycol dimethyl ether (DMDG), 4 weight parts of photosensitive monomer (made by Toa Gosei.Co, Aronix M315), 0.5 weight part of antifoam (made by San Nopco.Co, S-65) and 3.6 weight parts of N-methylpyrrolidone (NMP), followed by stirring to prepare a mixed composition.

(ii) Another vessel was charged with 12 weight parts of polyether sulfone (PES) and 14.49 weight parts of particulate epoxy resin (made by Sanyo Kasei.Co, Polymer Pol) having a mean particle diameter of 0.5 $\mu$m, followed by stirring. Then, 30 weight parts of NMP was added and the whole mixture was stirred in a beads mill to prepare another mixed composition.

(iii) A still another vessel was charged with 2 weight parts of imidazole curing agent (made by Shikoku Kasei.Co, 2E4MZ-CN), 2 weight parts of photopolymerization initiator (made by Ciba Specialty Chemicals.Co, Irgacure I-907), 0.2 weight part of photosensitizer (made by Nippon Kayaku.Co, DETX-S) and 1.5 weight parts of NMP, followed by stirring to give a mixed composition.

The mixed compositions prepared in (i), (ii) and (iii) above were blended to give an electroless plating adhesive.

C. Preparation of a Resin Filler (i) A vessel was charged with 100 weight parts of bisphenol F epoxy monomer (made by Yuka Shell.Co, mol. wt. 310, YL983U), 170 weight parts of silane coupler coated $SiO_2$ beads (made by Admatex.Co, CRS1101-CE) having a mean particle diameter of 1.6 $\mu$m and a maximum particle diameter of not more than 15 $\mu$m, and 1.5 weight parts of leveling agent (made by San Nopco.Co, Pelenol S4), followed by stirring to prepare a resin filler having a viscosity of 40 to 50 Pa·s at 23±1° C.

As the curing agent, 6.5 weight parts of imidazole curing agent (made by Shikoku Kasei.Co, 2E4MZ-CN) was used.

Figure 4:
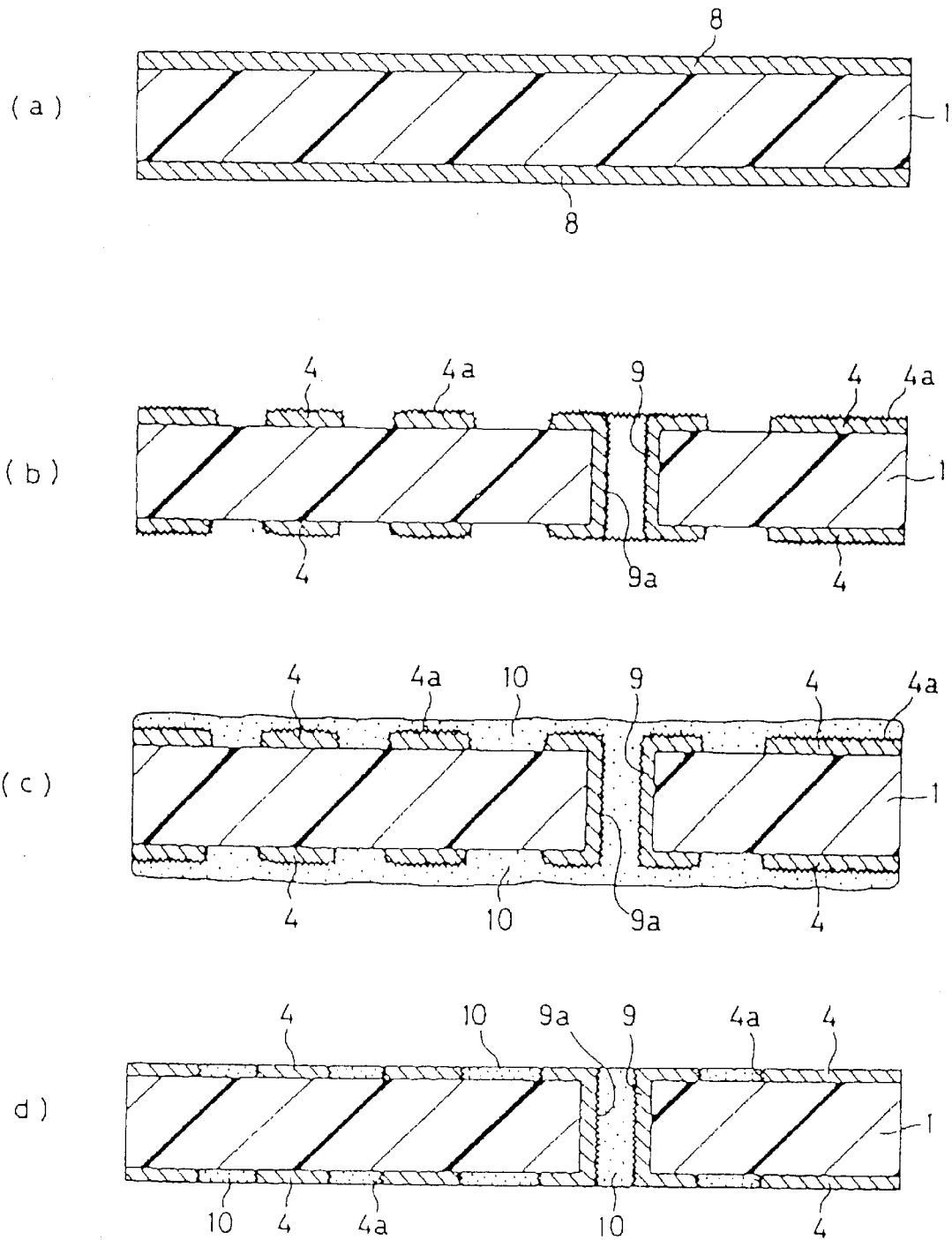
FIGS. 4(a) to (d) are sectional elevation views showing stages in the method of manufacturing a printed circuit board according to the invention.

D. Method of Manufacturing a Printed Circuit Board (1) A copper-clad laminate board prepared by laminating a 18 $\mu$m-thick copper foil 8 with either surface of a 1 mm-thick glass-epoxy or BT (bismaleimide-triazine) resin board 1 was used as the starting material (FIG. 4(*a*)). First, this copper-clad laminate board was drilled and electroless-plated and a pattern-wise etching was performed to form an under-level conductor circuit 4 on either side of the substrate 1 as well as a plated-through hole 9.

(2) The substrate formed with plated-through hole 9 and under-level conductor circuits 4 was rinsed with water and dried. Then, a blackening treatment using an aqueous solution containing NaOH (10 g/l), $NaClO_2$ (40 g/l) and $Na_3PO_4$ (6 g/l) as the blackening bath (oxidation bath) and a reduction treatment using an aqueous solution containing NaOH (10 g/l) and $NaBH_4$ (6 g/l) as the reduction bath were carried out to form roughened surfaces 4*a*, 9*a* over the entire under-level conductor circuit 4 inclusive of the plated-through hole 9 (FIG. 4(*b*)).

(3) The resin filler 10 prepared in C above was filled into the recessed areas around the conductor circuit 4 and the plated-through hole 9 within 24 hours after preparation.

For this filling operation, a printing technique using a squeezee was used. In the first place, chiefly the plated-through hole 9 was filled up and the filled resin was dried at 100° C. for 20 minutes. Then, the recessed areas around the conductor circuit were filled and the filled resin was dried under the same conditions as above (FIG. 4(*c*)).

(4) On one side of the substrate treated as above in the step (3), the resin filler layer 10 formed on top of the conductor circuit and the upper portion of the resin filler layer 10 formed in the non-circuit area were sanded off with a belt sander using a #600 belt sanding paper (made by Sankyo Rikagaku.Co). Then, buffing was carried out to get rid of the mars caused by said belt sanding. This polishing procedure was carried out on the other side of the substrate as well.

Where necessary, etching may be performed before or after polishing to level out the land 9a of plated-through hole 9 and the roughened surface 4a formed on the under-level conductor circuit 4.

Then, a heat treatment was carried out for 1 hour at 100° C. and 1 hour at 150° C., whereby the resin filler layer was thoroughly cured.

In this manner, there was obtained a printed circuit board in which the superficial part of the resin filler layer 10 in the plated-through hole 9 and non-circuit area and the surface of the under-level conductor circuit 4 had been flattened, the resin filler 10 and the lateral sides 4a of the under-level conductor circuit 4 had been firmly joined together through the roughened surface, and the inner wall surface 9a of plated-through hole 9 and the resin filler 10 had been tightly joined together through the roughened surface (FIG. 4(d))

(5) Then, the insulating board formed with a conductor circuit by the above procedure was alkali-degreased, soft-etched, and treated with a palladium chloride-organic acid catalyst solution to apply the Pd catalyst, followed by activation of the catalyst.

Figure 5:
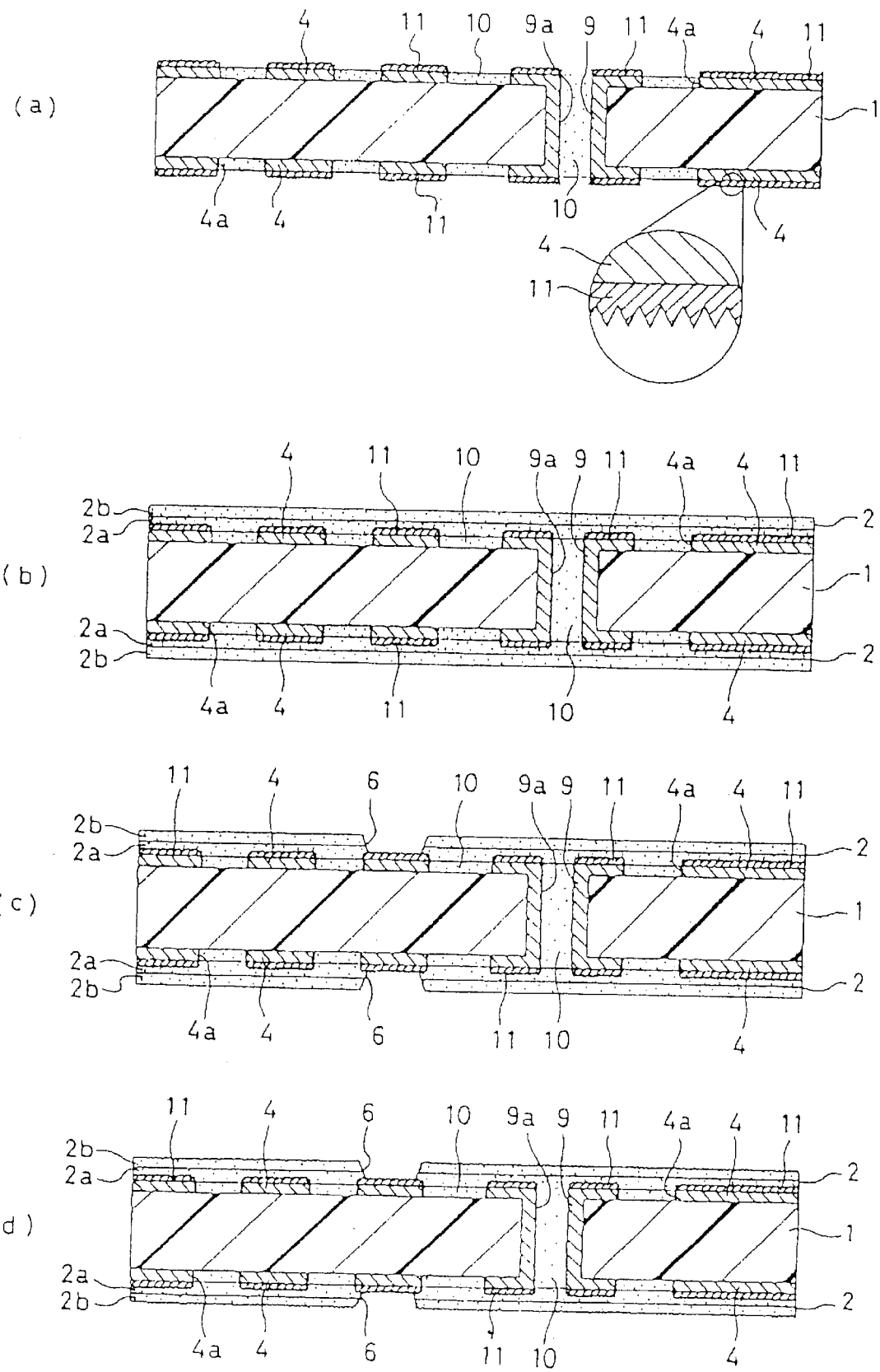
FIGS. 5(a) to (d) are sectional elevation views showing stages in the method of manufacturing a printed circuit board according to the invention.

Then, the substrate was dipped in an electroless copper plating bath (pH=9) comprising an aqueous solution of copper sulfate ($3.9 \times 10^{-2}$ mol/l), nickel sulfate ($3.8 \times 10^{-3}$ mol/l), sodium citrate ($7.8 \times 10^{-3}$ mol/l), sodium hypophosphite ($2.3 \times 10^{-1}$ mol/l) and a surfactant (made by Nisshin Chemical.Co, Surfinol 465) (1.0 g/l). After 1 minute of immersion, the substrate was vibrated both longitudinally and transversely with a frequency of once every 4 seconds to deposit a rough layer 11 made of Cu—Ni—P acicular alloy on the surface of the under-level conductor circuit and the land of the plated-through hole (FIG. 5(a)).

(6) Then, using a tin substitution plating solution (pH=1.2, temperature 35° C.) containing tin borofluoride (0.1 mol/l) and thiourea (1.0 mol/l), a Cu—Sn substitution reaction was carried out for an immersion time of 10 minutes to form a 0.3 μm -thick Sn layer on the surface of the roughened layer. The Sn layer is not shown on the drawing.

(7) Using the roll coater, both sides of the substrate were coated with the under-layer electroless plating adhesive (viscosity: 1.5 Pa·s) prepared in B above within 24 hours of preparation. For this coating, the substrate carrying a conductor layer on either side was set in vertical position between the co-operating rolls of the roll coater and the rolls were driven to apply the electroless plating adhesive. The resin rolls, used here, had 400 μm-deep grooves in the marginal area of the roll surface up to 30 mm from either roll end and 600 μm-deep grooves in the remaining area. Then, the substrate was allowed to sit in horizontal position for 20 minutes and, then, dried at 60° C. for 30 minutes.

Then, using the roll coater, the substrate was coated with the upper-layer electroless plating adhesive (viscosity: 7 Pa·s) prepared in A above within 24 hours of preparation in the same manner as in the application of the under-layer electroless plating adhesive. The substrate was allowed to sit in horizontal position for 20 minutes and dried at 60° C. for 30 minutes in the same manner as above, whereby 35 μm-thick electroless plating adhesive layers 2a, 2b were formed (FIG. 5(b)).

(8) A photomask film drawing a 85 μm-diameter circle was placed in close contact with either side of the substrate formed with electroless plating adhesive layers in the above step (7) and a ultra-high-pressure mercury vapor lamp was used to carry out an exposure at an intensity of 500 mJ/cm², followed by a spray development with a DMDG solution. Thereafter, the substrate was exposed to light at an intensity of 3000 mJ/cm² with the ultra-high-pressure mercury vapor lamp and a heat treatment was carried out for 1 hour at 100° C., 1 hour at 120° C., and 3 hours at 150° C. to form a 35 μm-thick interlaminar resin insulating layer 2 having an 85 μm-diameter opening 6 for via-hole which corresponded to the photomask film pattern with close tolerances (FIG. 5(c)). In this opening for via-hole, the tin plating layer was partially exposed.

(9) The substrate formed with said opening 6 for via-hole was immersed in an aqueous solution of chromic acid (7500 g/l) for 19 minutes to dissolve out the epoxy resin particles on the surface of the interlaminar resin insulating layer to prepare a rough surface having a roughening depth of 6 μm. Thereafter, the substrate was dipped in a neutralizing solution (made by Shipley.Co) and rinsed (FIG. 5(d)).

On the surface of the surface-roughened substrate, a palladium catalyst (made by Atotech.Co) was applied to deposit the catalyst nucleus on the surface of the interlaminar insulating layer and the inner wall of the opening for via-hole.

Figure 6:
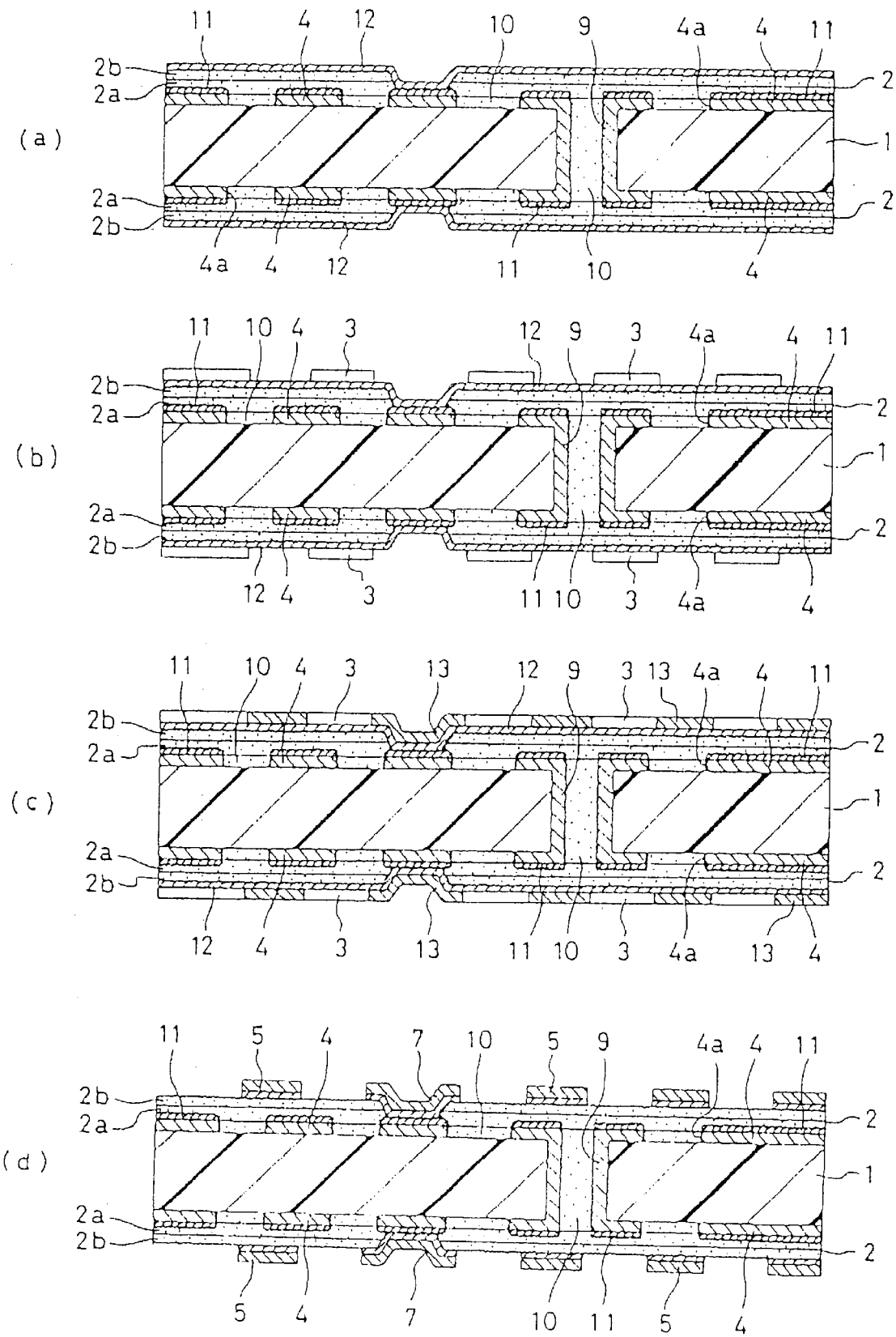
FIGS. 6(a) to (d) are sectional elevation views showing stages in the method of manufacturing a printed circuit board according to the invention.

(10) Then, the substrate was dipped in an electroless copper plating solution of the following composition to form a 0.6 to 1.2 μm-thick electroless copper plating layer 12 over the entire roughened surface (FIG. 6(a)).

[Electroless plating solution]

| | |
|---|---|
| EDTA | 0.08 mol/l |
| Copper sulfate | 0.03 mol/l |
| HCHO | 0.05 mol/l |
| NaOH | 0.05 mol/l |
| ·,·'-Bipyridyl | 80 mg/l |
| PEG (Polyethylene glycol) | 0.10 g/l |

[Electroless plating conditions]

20 minutes at a bath temperature of 65° C.

(11) A commercial photosensitive dry film was affixed to the electroless copper plating layer 12, and with a photomask set in position, an exposure at 100 mJ/cm² and a development with 0.8% sodium carbonate/$H_2O$ were carried out to form a 15 μm-thick plating resist 3. (FIG. 6(b)).

(12) Then, copper electroplating of the non-resist area was carried out under the following conditions to form a 15 μm-thick copper electroplating layer 13 (FIG. 6(c)).

[Electroplating solution]

| | |
|---|---|
| Sulfuric acid | 2.24 mol/l |
| Copper Sulfate | 0.26 mol/l |
| Additive (made by Atotech Japan. Co, Kaparacid HL) | 19.5 ml/l |

[Electroplating conditions]

| | |
|---|---|
| Current density | 1 A/dm² |
| Time | 65 min |
| Temperature | 22 ± 2° C. |

(13) Then, after the plating resist was stripped with 5% KOH/$H_2O$, the underlying electroless plating layer was etched and dissolved with sulfuric acid-hydrogen peroxide to form a discrete upper-level conductor circuit 5 (inclusive of via-hole 7) (FIG. 6(d)).

Figure 7:
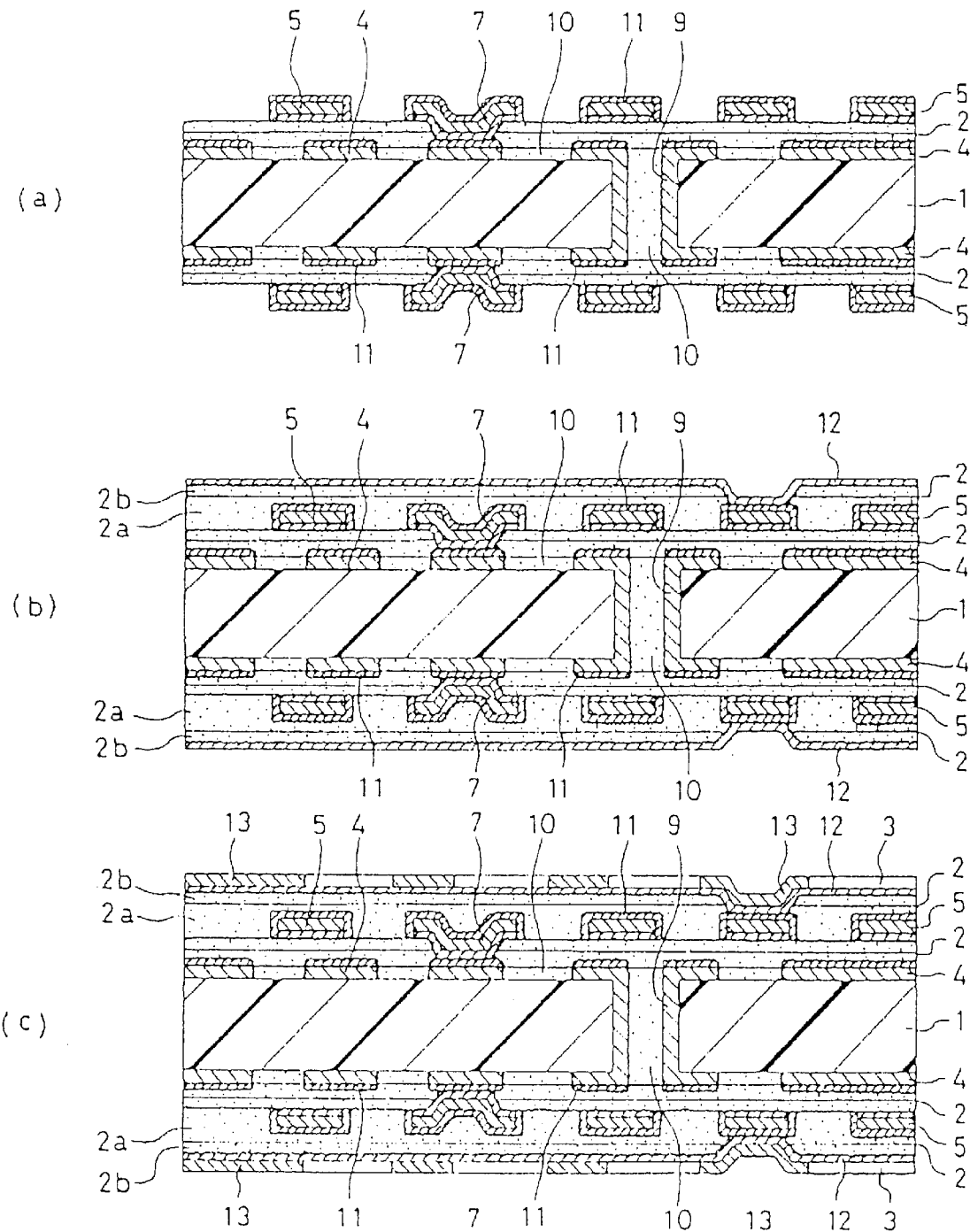
FIGS. 7(a) to (c) are sectional elevation views showing stages in the method of manufacturing a printed circuit board according to the invention.
Figure 8:
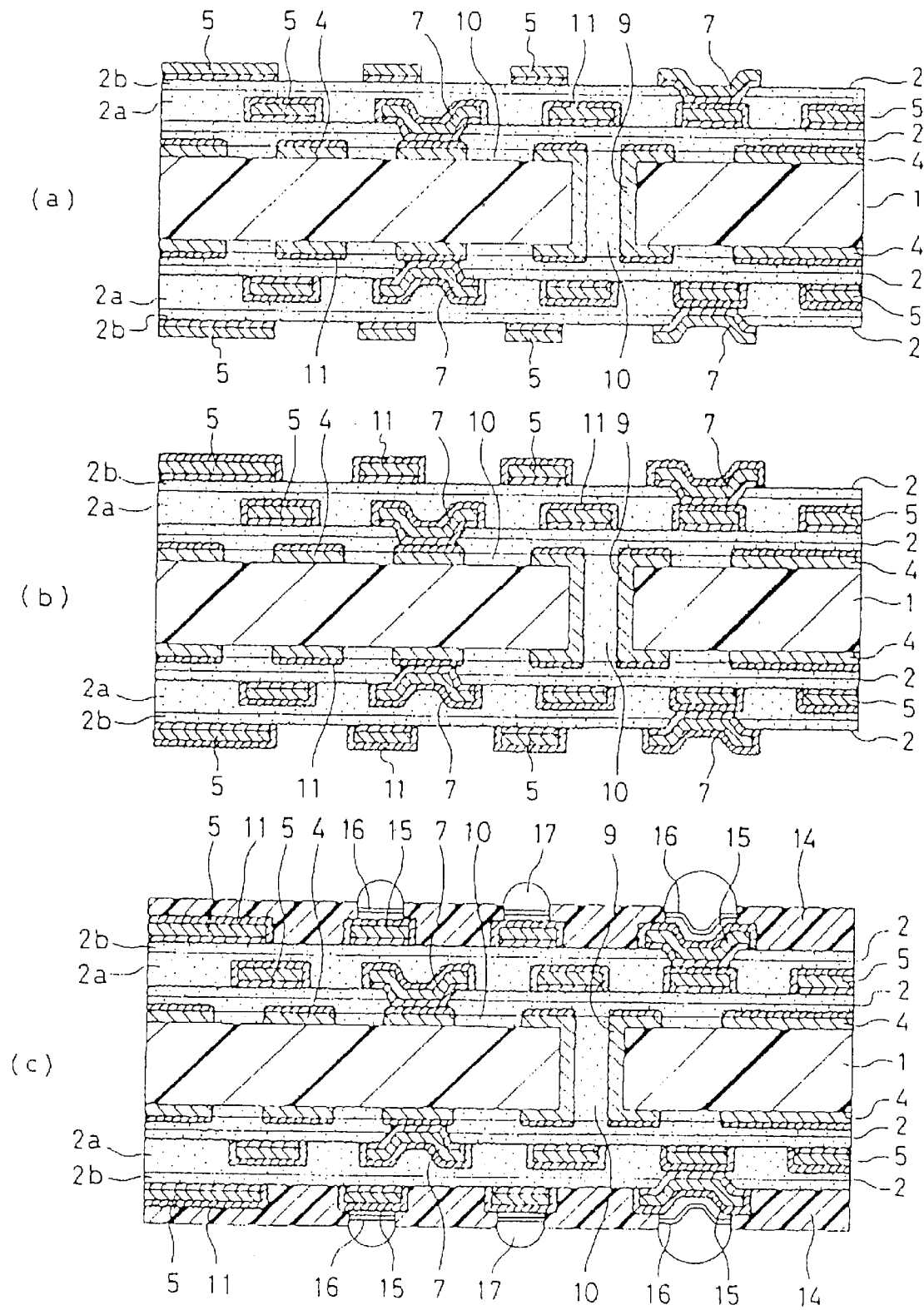
FIGS. 8(a) to (c) are sectional elevation views showing stages in the method of manufacturing a printed circuit board according to the invention.

(14) The substrate formed with this conductor circuit was subjected to the same treatment as in the step (5) to form a 2 μm-thick Cu—Ni—P acicular alloy rough layer 11 on the surface of the conductor circuit (FIG. 7(a)).

(15) Then, the above steps (6) to (14) were repeated to form a further upper-level conductor circuit (FIG. 7(b) to FIG. 8(b)).

(16) A vessel was charged with 46.67 weight parts of a photosensitized oligomer (mol. wt. 4000) prepared by acrylating 50% of the epoxy groups of cresol-novolac epoxy resin (made by Nippon Kayaku.Co) as dissolved in diethylene glycol dimethyl ether (DMDG) at a concentration of 60 weight %, 15 weight parts of bisphenol A epoxy resin (made by Yuka Shell.Co, Epikote™ 1001) dissolved in methyl ethyl ketone at a concentration of 80 weight %, 1.6 weight parts of imidazole curing agent (made by Shikoku Kasei.Co, tradename: 2E4MZ-CN), 3 weight parts of photosensitive polyfunctional acrylic monomer (made by Nippon Kayaku.Co, tradename: R604), 1.5 weight parts of the photosensitive polyvalent acrylic monomer (made by Kyoei Chemical.Co, tradename: DPE6A), and 0.71 weight part of a dispersion antifoam (made by San Nopco.Co, tradename: S-65), followed by stirring to give a mixed composition. To this mixed composition were added 2.0 weight parts of the photopolymerization initiator benzophenone (made by Kanto Chemical.Co) and 0.2 weight part of the photosensitizer Michler's ketone (made by Kanto Chemical.Co) to prepare a solder resist resin composition having a viscosity of 2.0 Pa·s at 25° C.

Viscosity measurement was carried out with a type B viscometer (made by Tokyo Instruments.Co, DVL-B) using Rotor No. 4 for 60 rpm or Rotor No. 3 for 6 rpm.

(17) Then, using the same roll coater as the one used for electroless plating adhesive, both sides of the multi-layer printed circuit board were coated with the above solder resist resin composition in a thickness of 20 μm in the same manner.

The resin applied was dried at 70° C. for 20 minutes and at 70° C. for 30 minutes. Then, with a 5 mm-thick photomask drawing a solder resist aperture pattern held in intimate contact with the solder resist layer, an exposure with ultraviolet light at 1000 mJ/cm$^2$ and a development with DMTG solution were carried out to form a hole with a diameter of 200 μm.

Then, a heat treatment was carried out at 80° C. for 1 hour, at 100° C. for 1 hour, at 120° C. for 1 hour, and at 150° C. for 3 hours to cure the solder resist layer, whereby a 20 μm-thick solder resist layer (an organic resin insulating layer) 14 with holes for solder pad was formed.

(18) Then, the substrate formed with the solder resist layer (organic resin insulating layer) was immersed in an electroless nickel plating bath (pH=4.5) containing nickel chloride ($2.3 \times 10^{-1}$ mol/l), sodium hypophosphite ($2.8 \times 10^{-1}$ mol/l) and sodium citrate ($1.6 \times 10^{-1}$ mol/l) for 20 minutes to form a 5 μm-thick nickel plating layer 15 in the hole. This substrate was dipped in an electroless plating solution containing gold potassium cyanide ($7.6 \times 10^{-3}$ mol/l), ammonium chloride ($1.9 \times 10^{-1}$ mol/l), sodium citrate a ($1.2 \times 10^{-1}$ mol/l) and sodium hypophosphite ($1.7 \times 10^{-1}$ mol/l) at 80° C. for 7.5 minutes to form a 0.03 μm-thick gold plating layer 16 on the nickel plating layer 15.

(19) Then, a solder paste was applied by printing to the openings of the solder resist layer 14 and allowed to flow at 200° C. to provide solder bumps 17, whereby a multilayer printed circuit board having solder bumps 17 was obtained (FIG. 8(c)).

EXAMPLE 2

A. The preparation of the electroless plating adhesive (upper-layer adhesive) and electroless plating adhesive (under-layer adhesive) and the preparation of the resin filler were carried out as described in Example 1.

B. Method of Manufacturing a Printed Circuit Board (1) A copper-clad laminate comprising a 18 μm-thick copper foil 8 laminated to either side of a 1.0 mm-thick glass-epoxy or BT (bismaleimide-triazine) resin board 1 was used as the starting material (FIG. 9(a)). First, this copper-clad laminate board was drilled, electroless-plated, and etched patternwise to form an under-level conductor circuit 4 on either side of the substrate 1 and a plated-through hole 9.

(2) The substrate formed with plated-through hole 9 and under-level conductor circuits 4 was rinsed with water and dried. Then, the substrate was subjected to a blackening treatment using an aqueous solution containing NaOH (10 g/l), NaClO$_2$ (40 g/l) and Na$_3$PO$_4$ (6 g/l) as the blackening (oxidation) bath and a reduction treatment using an aqueous solution containing NaOH (10 g/l) and NaBH$_4$ (6 g/l) as the reduction bath to form rough surfaces 4a, 9a over the entire under-level conductor circuit 4 inclusive of the plated-through hole 9 (FIG. 9(b)).

(3) The resin filler described in C above was prepared and a resin filler layer 10 was formed in the plated-through hole 9 and on the non-conductor circuit area and around the edge of the conductor circuit 4 on one side of the substrate 1 within 24 hours of preparation in the following manner.

Thus, using a squeezee, the resin filler was forced into the plated-through hole and the filled resin was dried at 100° C. for 20 minutes. Then, a mask drawing an aperture pattern corresponding to the non-conductor circuit area was placed in position on the substrate and using a squeezee, a resin filler layer 10 was formed in the non-conductor circuit area and dried at 100° C. for 20 minutes (FIG. 9(c)).

(4) One side of the substrate treated in the above step (3) was polished with a belt sander using a #600 belt sanding paper (made by Sankyo Rikagaku.Co) so that there would be no residues of the resin filler 10 on the surface of the inner-level copper pattern 4 and the land of the plated-through hole 9. Then, buffing was carried out to get rid of the mars caused by belt sanding. The procedure was repeated for the other side of the substrate.

Then, a heat treatment was carried out for 1 hour at 100° C., 3 hours at 120° C., 1 hour at 150° C. and 7 hours at 180° C. to cure the resin filler 10.

Figure 9:
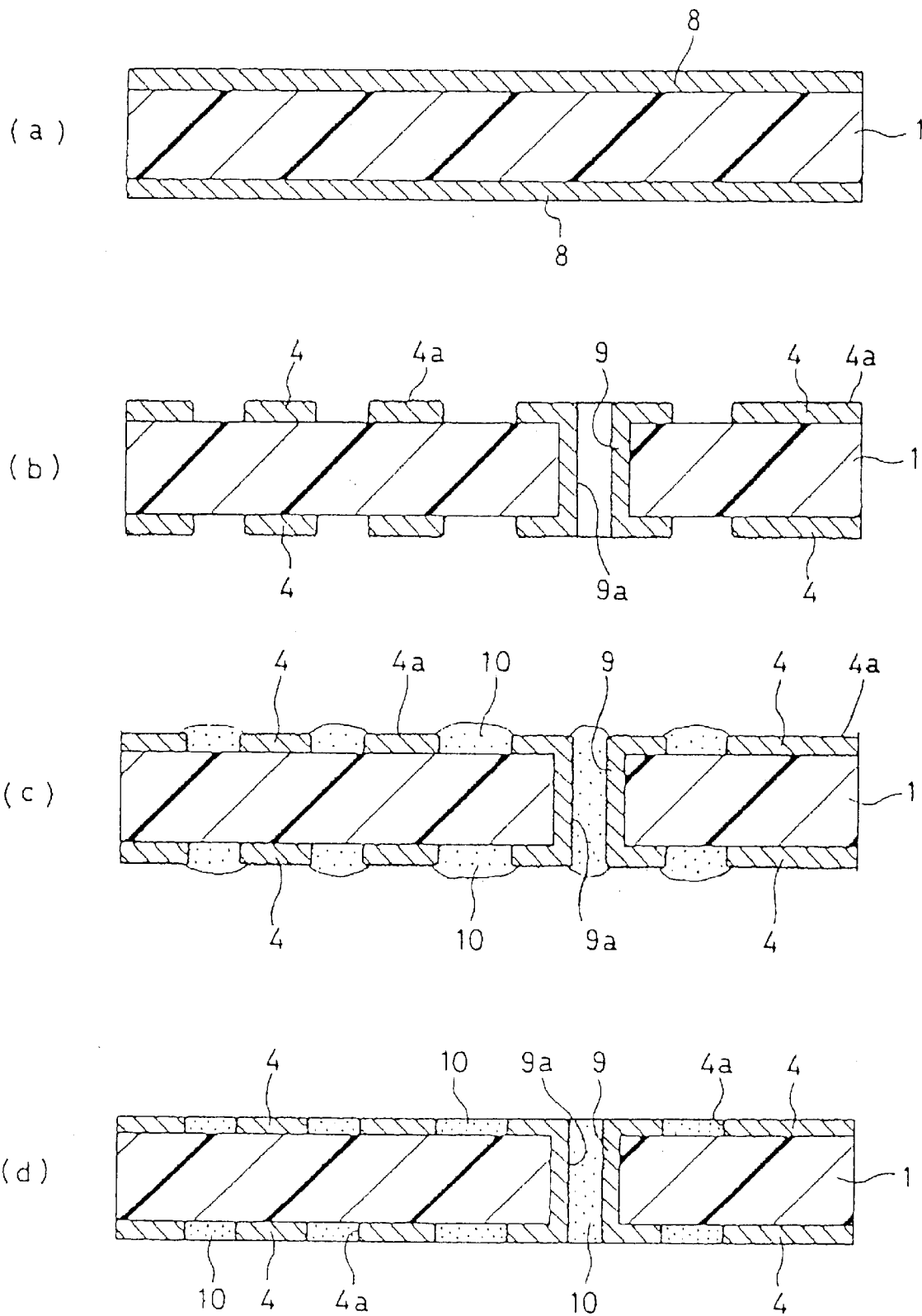
FIGS. 9(a) to (d) are sectional elevation views showing stages in the method of manufacturing a printed circuit board according to the invention.

In this manner, the superficial layer of the resin filler 10 deposited in the plated-through hole 9 and non-conductor circuit area and the surface of the under-level conductor circuit 4 were flattened, thus giving an insulating substrate in which the resin filler 10 and the lateral sides 4a of the under-level conductor circuit 4 had been firmly joined together through the roughened surface and the inner wall 9a of the plated-through hole 9 and the resin filler 10 had also been firmly joined together through the roughened surface (FIG. 9(d)).

Figure 10:
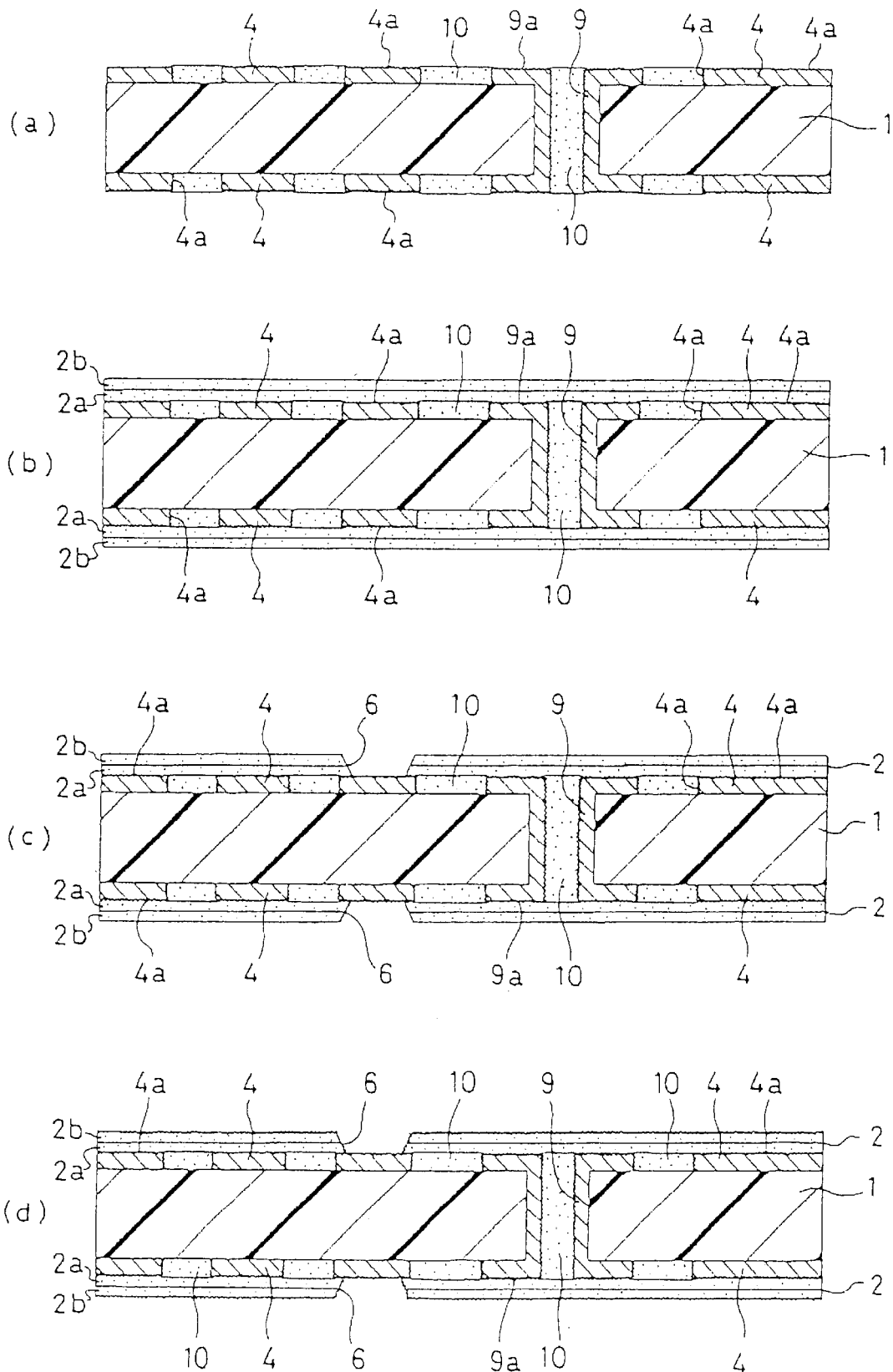
FIGS. 10(a) to (d) are sectional elevation views showing stages in the method of manufacturing a printed circuit board according to the invention.

(5) The above substrate was rinsed with water, degreased with an acid, and soft-etched. Then, an etching solution was sprayed against both sides of the substrate to etch the surface of the under-level conductor circuit 4 and the surface of the land of plated-through hole 9 to form rough surfaces 4a, 9a all over the under-level conductor circuit 4 (FIG. 10(*a*)). The etching solution used contained 10 weight parts of imidazole copper (II) complex, 7 weight parts of glycolic acid and 5 weight parts of potassium chloride (made by MEC.Co, MEC Etch Bond).

(6) Using the roll coater, both sides of the substrate were coated with the under-layer electroless plating adhesive (viscosity: 1.5 Pa·s) prepared in B above within 24 hours of preparation. For this coating, the substrate carrying a conductor circuit on either side was set in vertical position between the co-operating rolls of the roll coater and the rolls were driven to apply the electroless plating adhesive. In the roll coater used, the depth of grooves in the marginal area up to 30 mm from either end of the resin roll surface was 400 μm and the depth of grooves in the remaining area was 600 μm. Then, the substrate was allowed to sit in horizontal position for 20 minutes and dried at 60° C. for 30 minutes.

Then, using the roll coater, the substrate was coated with the upper-layer electroless plating adhesive (viscosity: 7 Pa·s) prepared in A above within 24 hours of preparation in the same manner as the application of the under-layer electroless plating adhesive. The substrate was allowed to sit in horizontal position for 20 minutes #1 and dried at 60° C. for 30 minutes, also in the same manner as above, to form 35 μm-thick electroless plating adhesive layers 2a, 2b (FIG. 10(*b*)).

(7) A photomask drawing a black circular mark (85 μm in diameter) drawn in light-screening ink was placed in intimate contact with either side of the substrate 1 formed with electroless plating adhesive layers 2a, 2b in the above step (6) and an exposure was carried out at an intensity of 3000 mJ/cm$^2$ using an ultra-high-pressure mercury vapor lamp. Thereafter, a heat treatment was carried out for 1 hour at 100° C., 1 hour at 120° C. and 3 hours at 150° C. to form a 35 μm-thick interlaminar resin insulating layer 2 having an 85 μm (dia.) opening 6 for via-hole which was true to the photomask pattern with close tolerances (FIG. 10(*c*)). In this connection, the tin plating layer was partially exposed in the opening 6.

(8) The substrate thus formed with the opening 6 for via-hole was dipped in a chromic acid-containing bath for 19 minutes to dissolve out the epoxy resin particles on the surface of the interlaminar resin insulating layer 2 and thereby roughen (6 μm deep) the surface of the interlaminar resin insulating layer 2. The substrate was then dipped in a neutralization bath (made by Shipley.Co) and rinsed with water (FIG. 10(*d*)).

Then, a palladium catalyst (made by Atotech.Co) was applied to the roughened surface of the substrate to deposit the catalyst nucleus on the surface of the interlaminar resin insulating layer 2 and the inner wall of the opening 6 for via-hole.

Figure 11:
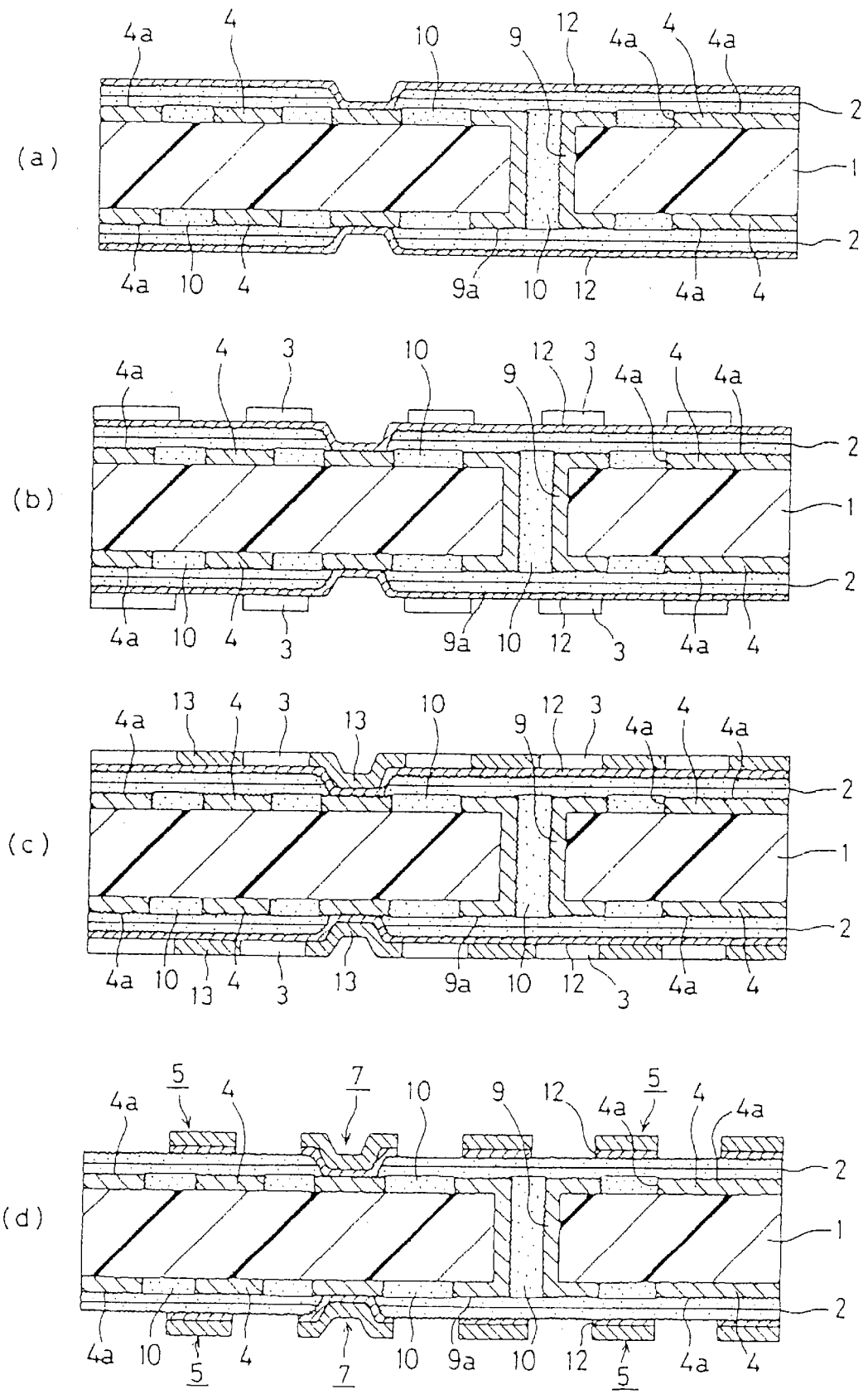
FIGS. 11(a) to (d) are sectional elevation views showing stages in the method of manufacturing a printed circuit board according to the invention.

(9) Then, the substrate was dipped in an aqueous electroless copper plating bath of the following composition to form a 0.6 to 1.2 μm-thick electroless copper plating film 12 all over the roughened surface (FIG. 11(*a*)).

[Electroless plating bath]

| | |
|---|---|
| NiSO$_4$ | 0.003 mol/l |
| Tartaric acid | 0.200 mol/l |
| Copper sulfate | 0.030 mol/l |
| HCHO | 0.050 mol/l |
| NaOH | 0.100 mol/l |
| ·,·'-Bipyridyl | 40 mg/l |
| Polyethylene glycol (PEG) | 0.10 g/l |

[Electroless plating conditions]

40 minutes at a bath temperature of 35° C.

(10) A commercial photosensitive dry film was affixed to the electroless copper plating layer 12 by hot-pressing, and with a photomask placed in position, an exposure was carried out at 100 mJ/cm$^2$. Then, a development was performed using 0.8% sodium carbonate to provide a 15 μm-thick plating resist 3 (FIG. 11(*b*)).

(11) Then, copper electroplating was carried out under the following conditions to form a 15 μm-thick copper electroplating layer 13 (FIG. 11(*c*)).

[Aqueous electroplating bath]

| | |
|---|---|
| Sulfuric acid | 2.24 mol/l |
| Copper sulfate | 0.26 mol/l |
| Additive | 19.5 ml/l |
| (made by Atotech Japan. Co, Kaparacid HL) | |

[Electroplating conditions]

| | |
|---|---|
| Current density | 1 A/dm$^2$ |
| Time | 65 min |
| Temperature | 22 ± 2° C. |

(12) The plating resist was stripped with 5% KOH and the underlying electroless plating film 12 was etched with sulfuric acid-hydrogen peroxide to form a 18 μm-thick conductor circuit (inclusive of via-hole 7) 5 consisting of an electroless copper plating layer 12 and a copper electroplating layer 13 (FIG. 11(*d*)).

Figure 12:
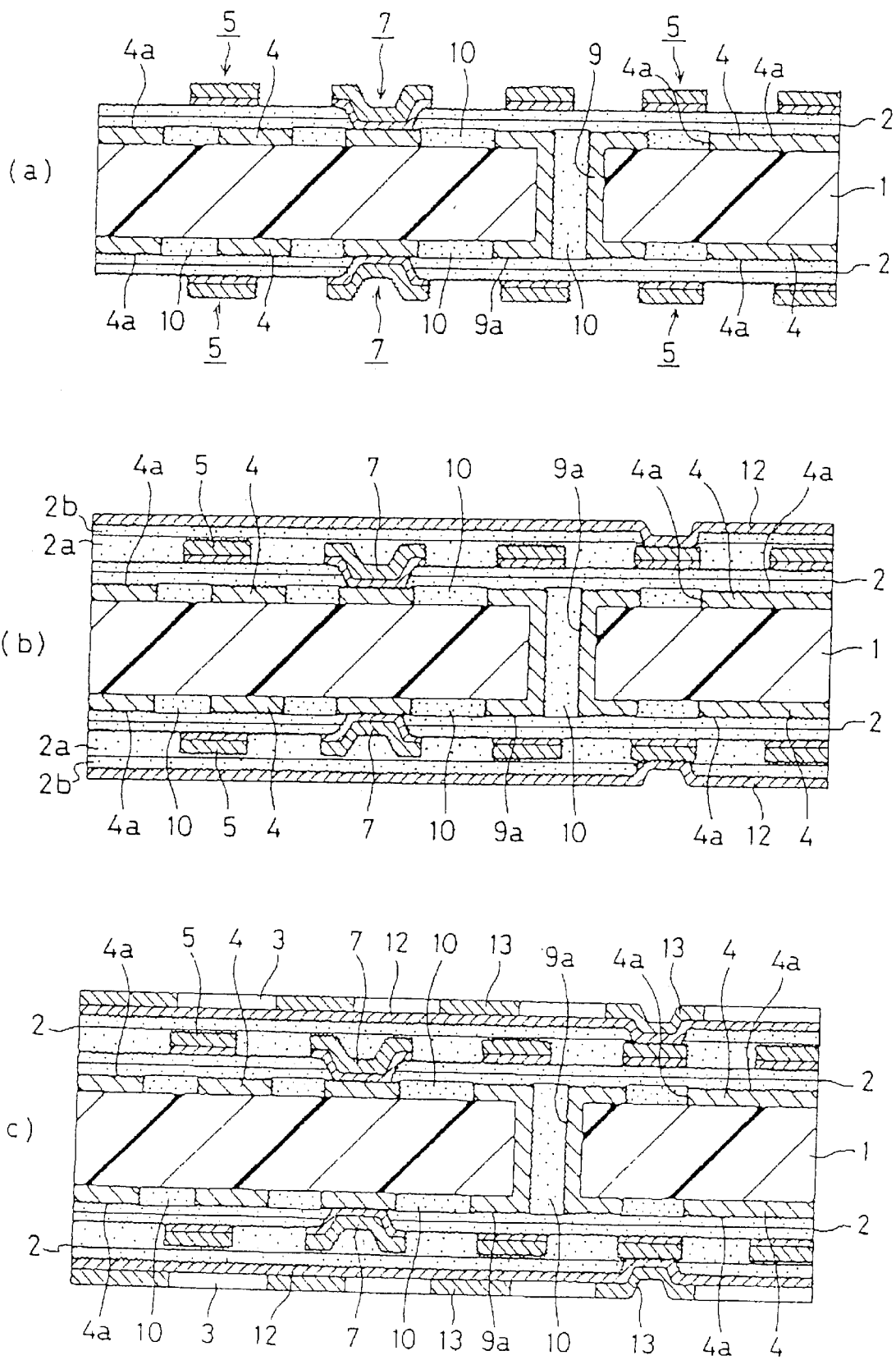
FIGS. 12(a) to (c) are sectional elevation views showing stages in the method of manufacturing a printed circuit board according to the invention.
Figure 13:
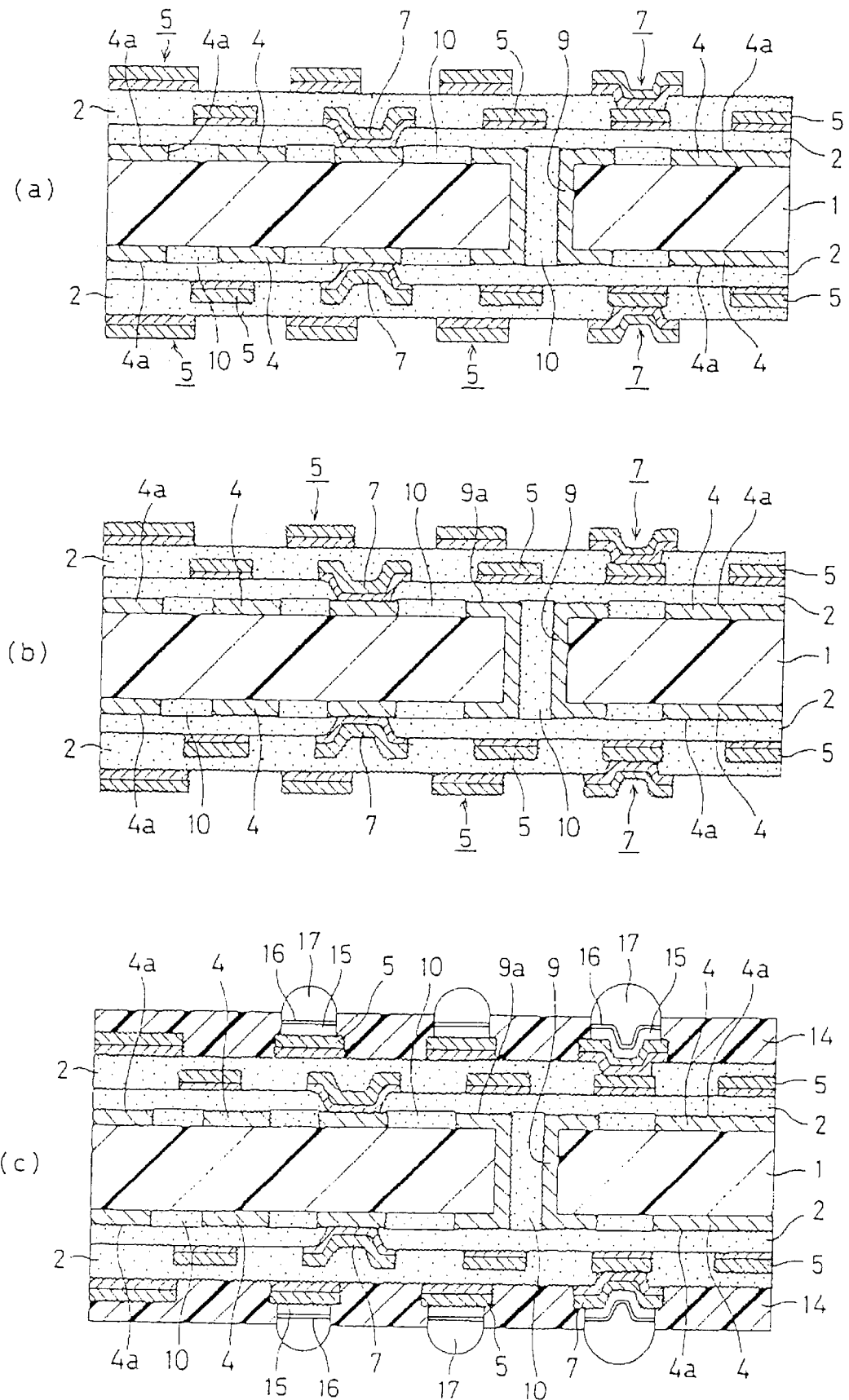
FIGS. 13(a) to (c) are sectional elevation views showing stages in the method of manufacturing a printed circuit board according to the invention.

(13) The above steps (5) to (12) were repeated to form a still another interlaminar resin insulating layer and another conductor circuit to give a multi-layer printed circuit board. However, no Sn substitution was carried out to form a cover layer on the top-level roughened surface (FIG. 12(*a*) to FIG. 13(*b*)).

(14) Then, a vessel was filled with 46.67 weight parts of photosensitive oligomer (mol. wt. 4000), prepared by acrylating 50% of the epoxy groups of cresol-novolac epoxy resin (made by Nippon Kayaku.Co), as dissolved in diethylene glycol dimethyl ether (DMDG) at a concentration of 60 weight %, 15 weight % of bisphenol A epoxy resin (made by Yuka Shell.Co, tradename: Epikote 1001) dissolved in methyl ethyl ketone at a concentration of 80 weight %, 1.6 weight parts of imidazole curing agent (made by Shikoku Kasei.Co, tradename: 2E4MZ-CN), 3 weight parts of the photosensitive monomer polyvalent acrylic monomer (made by Nippon Kayaku.Co, R604), and 1.5 weight parts of photosensitized polyvalent acrylic monomer (made by Kyoei Kagaku.Co, DPE6A), and 0.71 weight part of dispersion antifoam (made by San Nopco.Co, S-65), followed by stirring to prepare a mixed composition. To this mixed composition were added 2.0 weight parts of the photopolymerization initiator benzophenone (made by Kanto Chemical.Co) and 0.2 weight part of the photosensitizer Michler's ketone (made by Kanto Chemical.Co) to prepare a solder resist resin composition having a viscosity of 2.0 Pa·s at 25° C.

viscosity measurement was made with a type-B viscometer (made by Tokyo Instruments.Co DVL-B) using No. 4 Rotor for 60 rpm and No. 3 Rotor for 6 rpm.

(15) Then, using the same roll coater as the one used for adhesive for electroless plating adhesive, the above solder resist resin composition was applied in a thickness of 20 µm on either side of the multilayer printed circuit board by the same procedure as used for electroless plating.

Thereafter, the coat was dried for 20 minutes at 70° C. and 30 minutes at 70° C. A 5 mm-thick photomask drawing a solder resist aperture pattern was set in intimate contact with the solder resist layer and an exposure with UV light at 1000 mJ/cm$^2$ and a development with DMTG solution were carried out to form holes with a diameter of 200 µm.

Then, a heat treatment was carried out for 1 hour at 80° C., 1 hour at 100° C., 1 hour at 120° C. and 3 hours at 150° C. to cure the solder resist layer to form a 20 µm-thick solder resist layer 14 having holes.

(16) A sodium persulfate-based etching solution was prepared at a concentration corresponding to an etching rate of 2 µm or so per minute and the above-treated substrate was dipped in the etching solution for 1 minute to give an average surface roughness of Ra=1 µm.

(17) The surface-roughened substrate was immersed in an electroless nickel plating bath (pH=4.5) containing nickel chloride ($2.3 \times 10^{-1}$ mol/l), sodium hypophosphite ($2.8 \times 10^{-1}$ mol/l) and sodium citrate ($1.6 \times 10^{-1}$ mol/l) for 20 minutes to form a 5 µm-thick nickel plating layer 15 in the holes. The substrate was further dipped in an electroless plating bath containing gold potassium cyanide ($7.6 \times 10^{-3}$ mol/l), ammonium chloride ($1.9 \times 10^{-1}$ mol/l), sodium citrate ($1.2 \times 10^{-1}$ mol/l) and sodium hypophosphite ($1.7 \times 10^{-1}$ mol/l) at 80° C. for 7.5 minutes to form a 0.03 µm-thick gold layer 16 on top of the nickel plating layer 15.

(18) Then, a solder paste was applied by printing to the holes in the solder resist layer 14 and allowed to reflow at 200° C. to form solder bumps 17, whereby a multilayer printed circuit board having solder bumps 17 was obtained (FIG. 13(c)).

EXAMPLE 3

In the steps (7) and (8), interlaminar resin insulating layer was constructed by forming the holes for via-hole by means of $CO_2$ laser after laminating a resin film for interlaminar resin insulating layer on the substrate and curing it. Otherwise, the same procedure as Example 1 was followed to give a multi-layer printed circuit board. Said interlaminar resin insulating layer film is formed following the procedure below. That is; A vessel was charged with 30 weight parts of bisphenol A epoxy resin (Epoxy equivalent: 469, made by Yuka Shell Epoxy.Co, Epicoat1001), 40 weight parts of cresol-novolac epoxy resins (Epoxy equivalent: 215 made by Dainippon ink.Co and chemicals, Epiclon N-673)and 30 weight parts of phenol-novolac resins containing triazine structure (Phenyl hydroxy equivalent: 120, made by Dainippon ink and chemicals.Co, Phenolite KA-7052), followed by mixing with heat treatment to dissolve into 20 weight parts of ethyl diglycol acetate and 20 weight parts of solvent naphtha. Then, 15 weight parts of end-epoxydated Ipolybutadiene rubber (made by Nagase Chemicals.Co, Denalex R-45EPT), 1.5 weight weight parts of powdered 2-phenil-4,5-bis(hydroxymethyl) imidazole, 2 weight parts of fine-powdered silica and 0.5 weight parts of silicone antifoam were further added to produce epoxy resin composition. Then, using the roll coater, the obtained epoxy resin composition was applied on a 38 µm-thick PET film to leave a 50 µm-thick film after drying. Thereafter, the coat was dried for 10 minutes at 80 to 120° C. to form interlaminar resin insulating resin film.

Comparative Example 1

In the steps where the electroless plating adhesive and solder resist resin composition were applied to the substrate formed with a conductor circuit, namely in said step (6) and step (15), a roll coater having a uniform groove depth of 600 µm throughout the roll surface but otherwise of the same construction as the roll coater used in Example 1 was used to form an interlaminar resin insulating layer and a solder resist layer. Otherwise, the same procedure as Example 1 was followed to give a printed circuit board.

From each of the printed circuit boards manufactured in Examples 1 and 2 and Comparative Example 1, pertinent portions were cut out with a cutter and the thicknesses (center and ends) of the interlaminar resin insulating layer and solder resist layer were measured. In addition, an observation was made for resin residues in the via-hole and the hole diameter was measured. Table 1 below sets forth the thicknesses (center and ends) of the interlaminar resin insulating layer and solder resist layer and the frequency of resin residues, no-hole defect and holes smaller than the designed size.

Furthermore, each of the printed circuit boards was subjected to a conduction test before and after a reliability test to check for disconnection or short-circuit. The reliability test was carried out by allowing each printed circuit board to sit in an atmosphere of 85% R. H. and 85° C. under application of a bias voltage of 1.2 V for 200 hours. The results are shown below in Table 1.

TABLE 1

| | Evaluation parameters | | Ex. 1 | Ex. 2 | Ex. 3 | Compar. Ex. 1 |
|---|---|---|---|---|---|---|
| Inter laminar insulating layer | Thickness (µm) | Center | 33 | 33 | — | 33 |
| | | Ends | 33 | 33 | — | 36 |
| | Condition of via-hole (frequency of rejection) (%) | Resin residues | 0 | 0 | — | 0 |
| | | No hole | 0 | 0 | — | 0 |
| | | Hole too small | 0 | 0 | — | 0 |
| Solder resist layer | Thickness (µm) | Center | 22 | 22 | 22 | 22 |
| | | Ends | 22 | 22 | 22 | 26 |
| | Condition of solder bump (frequency of rejection) (%) | Resin residues | 0 | 0 | 0 | 2 |
| | | No hole | 0 | 0 | 0 | 6 |
| | | Hole too small | 0 | 0 | 0 | 15 |

TABLE 1-continued

| | Evaluation parameters | | Ex. 1 | Ex. 2 | Ex. 3 | Compar. Ex. 1 |
|---|---|---|---|---|---|---|
| Conduction test | Before reliability test (after manufacture of printed circuit board) | Disconnection | None | None | None | Found |
| | | Short-circuit | None | None | None | None |
| | After reliability test | Disconnection | None | None | None | Found |
| | | Short-circuit | None | None | None | None |

It will be apparent from Table 1 that, in the printed circuit boards according to Examples 1 to 3, both the interlaminar insulating layer and solder resist layer were uniform in thickness, the condition of the holes formed was wholesome, and the incidence of disconnection or short-circuit was nil in the conduction tests before and after reliability testing. In the printed circuit board obtained in Comparative Example 1, however, the interlaminar insulating layer and solder resist layer were not uniform in thickness and the solder bumps were poor in condition.

Industrial Applicability

With the roll coater of the present invention as described above, an interlaminar resin insulating layer and a solder resist layer can be formed with good thickness uniformity and the no-hole defect or anomalies in the diameter and geometry of holes for via-hole and solder bump due to uneven layer thicknesses are precluded, enabling the manufacture of a printed circuit board with satisfactory electrical continuity and reliability.

Furthermore, in accordance with the present method of manufacturing a printed circuit board, thanks to the use of the above roll coater in the formation of interlaminar insulating and solder resist layers, the interlaminar resin insulating layer and solder resist layer can be formed with good thickness uniformity and the no-hole defect or anomalies in the diameter and geometry of holes for via-hole and solder bump due to uneven layer thicknesses are precluded, thus enabling the manufacture of a printed circuit board with good electrical continuity and reliability.

What is claimed is:

1. A roll coater for forming an interlaminar resin insulating layer and/or a solder resist layer in the manufacture of a printed circuit board comprising a substrate and, as serially built up thereon, a conductor layer and an interlaminar resin insulating layer in an alternate fashion and in repetition, with a solder resist layer formed on top of the resulting multilayer structure, which roll coater comprising a roll having a surface formed with a multiplicity of grooves running in the direction of roll rotation, with the depth of the grooves in both end marginal areas of said roll surface being relatively reduced as compared with the depth of the grooves in the remaining area, the depth of the grooves in the outermost regions of said marginal areas being 10 to 50% less than the depth of the grooves in the other region the width of the roll surface where the depth of grooves is relatively reduced as compared with the remaining area is not greater than 5 cm and both edges of said roll coater comprising a guide at each end of the roll.

2. The roll coater according to claim 1, wherein the depth of the grooves in said end marginal areas is progressively reduced toward the corresponding ends of the roll.

3. A method of manufacturing a printed circuit board comprising forming a conductor layer and an interlaminar resin insulating layer in an alternate fashion and in repetition on a substrate and forming a solder resist layer on top of the resulting multilayer structure, characterized in that said interlaminar resin insulating layer and/or said solder resist layer is formed by means of the roll coater claimed in claim 1, and holes are formed in said interlaminar resin insulating layer and/or said solder resist layer by placing a photomask thereon followed by exposure to light.

4. A method of manufacturing a printed circuit board comprising forming a conductor layer and an interlaminar resin insulating layer in an alternate fashion and in repetition on a substrate and forming a solder resist layer on top of the resulting multilayer structure, characterized in that said interlaminar resin insulating layer and/or said solder resist layer is formed by means of the roll coater claimed in claim 2, and holes are formed in said interlaminar resin insulating layer and/or said solder resist layer by placing a photomask thereon followed by exposure to light.

5. The roll coater according to claim 1, wherein the diameter of the guide is smaller than the diameter of the thickest part of the roll.

6. The roll coater according to claim 1, wherein the guide prevents an increase of a clearance between the substrate and the roll surface.

7. The roll coater according to claim 1, wherein the interlaminar resin insulating layer and/or the solder resist comprises a photosensitive resin.

* * * * *